(12) United States Patent
Lin et al.

(10) Patent No.: US 10,546,808 B2
(45) Date of Patent: *Jan. 28, 2020

(54) METHODS OF MAKING WIRING SUBSTRATE FOR STACKABLE SEMICONDUCTOR ASSEMBLY AND MAKING STACKABLE SEMICONDUCTOR ASSEMBLY

(71) Applicant: BRIDGE SEMICONDUCTOR CORP., Taipei (TW)

(72) Inventors: Charles W. C. Lin, Singapore (SG); Chia-Chung Wang, Hsinchu County (TW)

(73) Assignee: BRIDGE SEMICONDUCTOR CORP., Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/872,828

(22) Filed: Jan. 16, 2018

(65) Prior Publication Data

US 2018/0158770 A1 Jun. 7, 2018

Related U.S. Application Data

(63) Continuation-in-part of application No. 15/863,998, filed on Jan. 8, 2018, and a continuation-in-part of
(Continued)

(51) Int. Cl.
*H01L 23/49* (2006.01)
*H01L 23/498* (2006.01)
(Continued)

(52) U.S. Cl.
CPC .... *H01L 23/49861* (2013.01); *H01L 21/4803* (2013.01); *H01L 21/4828* (2013.01);
(Continued)

(58) Field of Classification Search
CPC ....... C08L 33/12; C08L 51/04; C08L 2205/02; C08L 33/20; C08F 220/14; C08F 212/08; C08F 220/44; C08J 2409/00; H01L 21/4803; H01L 21/4828; H01L 21/4846; H01L 2224/48247; H01L 2224/48257; H01L 2224/73265; H01L 2225/1041; H01L 2225/1058; H01L 23/13; H01L 23/3121;
(Continued)

(56) References Cited

U.S. PATENT DOCUMENTS 5,075,759 A * 12/1991 Moline ................... H01L 23/66
257/692
5,438,478 A * 8/1995 Kondo ................ H01L 23/4334
174/260
(Continued)

*Primary Examiner* — Mohammed Shamsuzzaman
(74) *Attorney, Agent, or Firm* — Muncy, Geissler, Olds & Lowe, P.C.

(57) ABSTRACT

The wiring substrate includes a cavity and a plurality of metal leads disposed around the cavity. The metal leads are bonded with a resin compound and provide horizontal and vertical routing for a semiconductor device to be disposed in the cavity. The resin compound fills in spaces between the metal leads and surrounds the cavity and provides a dielectric platform for a re-distribution layer or a build-up circuitry optionally deposited thereon.

14 Claims, 27 Drawing Sheets

Related U.S. Application Data application No. 15/787,366, filed on Oct. 18, 2017, now Pat. No. 10,199,321, and a continuation-in-part of application No. 15/642,256, filed on Jul. 5, 2017, now abandoned, and a continuation-in-part of application No. 15/642,253, filed on Jul. 5, 2017, which is a continuation-in-part of application No. 15/642,253, filed on Jul. 5, 2017, and a continuation-in-part of application No. 15/642,256, filed on Jul. 5, 2017, now abandoned, application No. 15/787,366, which is a continuation-in-part of application No. 15/247,443, filed on Aug. 25, 2016, now Pat. No. 9,825,009, application No. 15/642,253, which is a continuation-in-part of application No. 14/846,987, filed on Sep. 7, 2015, application No. 15/863,998, which is a continuation-in-part of application No. 14/846,987, filed on Sep. 7, 2015, which is a continuation-in-part of application No. 14/621,332, filed on Feb. 12, 2015, now abandoned, application No. 15/863,998, which is a continuation-in-part of application No. 14/621,332, filed on Feb. 12, 2015, now abandoned, application No. 15/642,253, which is a continuation-in-part of application No. 14/621,332, filed on Feb. 12, 2015, now abandoned.

(60) Provisional application No. 62/214,187, filed on Sep. 3, 2015, provisional application No. 61/949,652, filed on Mar. 7, 2014.

(51) Int. Cl.
    *H01L 21/48*     (2006.01)
    *H01L 23/00*     (2006.01)
    *H01L 23/31*     (2006.01)
    *H01L 25/10*     (2006.01)

(52) U.S. Cl.
CPC ...... *H01L 21/4846* (2013.01); *H01L 23/3185* (2013.01); *H01L 24/48* (2013.01); *H01L 24/73* (2013.01); *H01L 25/105* (2013.01); *H01L 2224/48247* (2013.01); *H01L 2224/48257* (2013.01); *H01L 2224/73265* (2013.01); *H01L 2225/1041* (2013.01); *H01L 2225/1058* (2013.01); *H01L 2924/15153* (2013.01); *H01L 2924/1715* (2013.01); *H01L 2924/182* (2013.01)

(58) Field of Classification Search
CPC .......... H01L 23/3185; H01L 23/49548; H01L 23/49838; H01L 23/49861; H01L 24/48; H01L 24/73; H01L 25/105; H01L 2924/15153; H01L 2924/1715; H01L 2924/182
See application file for complete search history.

(56) References Cited

U.S. PATENT DOCUMENTS

| | | | | |
|---|---|---|---|---|
| 5,973,388 | A * | 10/1999 | Chew | H01L 23/49562 257/666 |
| 6,285,075 | B1 * | 9/2001 | Combs | H01L 23/4334 257/675 |
| 7,894,203 | B2 * | 2/2011 | Kariya | H01L 23/49827 361/763 |
| 7,989,950 | B2 * | 8/2011 | Park | H01L 23/3128 257/724 |
| 9,825,009 | B2 * | 11/2017 | Lin | H01L 25/0657 |
| 10,199,321 | B2 * | 2/2019 | Lin | H01L 23/13 |
| 10,211,067 | B1 * | 2/2019 | Lin | H01L 21/4857 |
| 2004/0066693 | A1 * | 4/2004 | Osako | B29C 45/14655 365/222 |
| 2009/0046183 | A1 * | 2/2009 | Nishida | H01L 21/6835 348/294 |
| 2009/0121341 | A1 * | 5/2009 | Oi | H01L 21/4867 257/701 |
| 2013/0032388 | A1 * | 2/2013 | Lin | H01L 23/3121 174/261 |

* cited by examiner

METHODS OF MAKING WIRING SUBSTRATE FOR STACKABLE SEMICONDUCTOR ASSEMBLY AND MAKING STACKABLE SEMICONDUCTOR ASSEMBLY

CROSS REFERENCE TO RELATED APPLICATIONS

This application is a continuation-in-part of U.S. application Ser. No. 15/642,253 filed Jul. 5, 2017, a continuation-in-part of U.S. application Ser. No. 15/642,256 filed Jul. 5, 2017, a continuation-in-part of U.S. application Ser. No. 15/787,366 filed Oct. 18, 2017 and a continuation-in-part of U.S. application Ser. No. 15/863,998 filed Jan. 8, 2018. The U.S. application Ser. No. 15/642,253 is a continuation-in-part of U.S. application Ser. No. 14/621,332 filed Feb. 12, 2015 and a continuation-in-part of U.S. application Ser. No. 14/846,987 filed Sep. 7, 2015. The U.S. application Ser. No. 15/787,366 is a continuation-in-part of U.S. application Ser. No. 15/247,443 filed Aug. 25, 2016. The U.S. application Ser. No. 15/863,998 is a continuation-in-part of U.S. application Ser. No. 14/621,332 filed Feb. 12, 2015, a continuation-in-part of U.S. application Ser. No. 14/846,987 filed Sep. 7, 2015, a continuation-in-part of U.S. application Ser. No. 15/642,253 filed Jul. 5, 2017 and a continuation-in-part of U.S. application Ser. No. 15/642,256 filed Jul. 5, 2017. The U.S. application Ser. No. 14/621,332 claims the benefit of filing date of U.S. Provisional Application Ser. No. 61/949,652 filed Mar. 7, 2014. The U.S. application Ser. No. 14/846,987 is a continuation-in-part of U.S. application Ser. No. 14/621,332 filed Feb. 12, 2015. The U.S. application Ser. No. 15/247,443 claims the benefit of filing date of U.S. Provisional Application Ser. No. 62/214,187 filed Sep. 3, 2015. The entirety of each of said Applications is incorporated herein by reference.

FIELD OF THE INVENTION

The present invention relates to methods of making a wiring substrate and making a semiconductor assembly and, more particularly, to a method of making a wiring substrate having a cavity surrounded by an array of metal leads for vertical interconnection channel, and a method of making a stackable semiconductor assembly using the wiring substrate.

DESCRIPTION OF RELATED ART

Market trends of multimedia devices demand for faster and slimmer designs. One of the approaches is to assemble multiple devices on a wiring substrate with stacking configuration so that the electrical performance can be improved and the form-factor can be further minimized. U.S. Pat. No. 7,894,203 discloses a wiring substrate having a cavity for such kind of purpose. The disclosed substrate is made of two separated parts bonded together by an adhesive. The electrical connection between them is through a conductive material such as solder or conductive bump. As the substrate is a stacked structure, warpage or thermal expansion coefficient (CTE) mismatches between these two parts will result in dislocation or solder cracking, making this kind of stacking structure unreliable for practical usage. Alternatively, as described in U.S. Pat. No. 7,989,950, vertical connection channel is formed by attaching a solder ball on a substrate and sealed by encapsulation and thus form a cavity. Again, solder deforming and cracking in the encapsulation, or delamination between the encapsulant and the substrate after thermal cycling may lead to abrupt device failure and I/O disconnection.

For the reasons stated above, and for other reasons stated below, developing a wiring substrate having integral metal leads extending to the top and bottom of the wiring substrate for 3D stacking of semiconductor assembly would be highly desirable.

SUMMARY OF THE INVENTION

An objective of the present invention is to provide a method of making a wiring substrate having a cavity by etching of a sacrificial metal slug at a designated location. As this sacrificial metal slug is mechanically supported and physically surrounded by a resin compound, once a selected portion of metal is removed, a cavity with well-defined size and depth can be formed and surrounded by the resin compound, thereby allowing a device to be disposed in the cavity without contributing much thickness to the final assembly.

Another objective of the present invention is to provide a method of making a wiring substrate having vertical stacking channel by providing a plurality of metal leads surrounding a cavity. As a result, a device disposed in the cavity can be stacked with another device through the metal leads without the need for other external interconnection.

Yet another objective of the present invention is to provide a method of making a wiring substrate with all the elements bonded together by a resin compound, thereby allowing a stable mechanical structure that can endure thermal cycling without suffering solder cracking, warping or dislocation.

Yet another objective of the present invention is to provide a method of making a wiring substrate optionally having a routing circuitry so that the electrical signal can be re-distributed from the peripheral leads to the designated location and the electrical characteristics of the resulting semiconductor assembly can be greatly improved.

In accordance with the foregoing and other objectives, the present invention provides a method of making a wiring substrate, comprising: providing a metal frame, a metal slug and a plurality of metal leads, wherein the metal slug is located within the metal frame, and the metal leads are integrally connected to the metal frame and each has an inner end directed inwardly away from the metal frame and directed toward the metal slug; providing a resin compound that fills in remaining spaces within the metal frame, wherein the resin compound has a top surface substantially coplanar with top sides of the metal leads and the metal slug; and removing at least one selected portion of the metal slug to form a cavity, wherein the cavity has an entrance at the top surface of the resin compound. Optionally, the method of making the wiring substrate may further comprise step(s) of: forming a top re-distribution layer on the top surface of the resin compound and electrically coupled to the metal leads; and/or forming a bottom build-up circuitry on a bottom surface of the resin compound and electrically coupled to the metal leads. Additionally, the present invention also provides a method of making a stackable semiconductor assembly, comprising steps of: providing the aforementioned wiring substrate by the above-mentioned method, and disposing a semiconductor device in the cavity of the wiring substrate and electrically coupling the semiconductor device to the wiring substrate through bonding wires.

Unless specifically indicated or using the term "then" between steps, or steps necessarily occurring in a certain order, the sequence of the above-mentioned steps is not limited to that set forth above and may be changed or reordered according to desired design.

The methods of making a wiring substrate and making the related 3D stackable semiconductor assembly using the wiring substrate according to the present invention have numerous advantages. For instance, providing the metal leads around the cavity is particularly advantageous as the semiconductor device can be disposed in the cavity and the metal leads can be electrically connected to the semiconductor device by the bonding wires and offer horizontal routing and vertical connecting channels between two opposites side of the wiring substrate. As the semiconductor device is disposed in the cavity, no extra grinding or lapping is needed for the semiconductor device in order to achieve ultra-thin vertically stacked semiconductor assembly feature. Binding the resin compound to the metal leads can provide a integral platform for high resolution circuitries disposed thereon. Depositing the re-distribution layer on the resin compound can enhance routing flexibility of the wiring substrate and allow fine pitch assemblies such as flip chip and surface mount component to be assembled thereon and interconnected to the metal leads by the re-distribution layer.

These and other features and advantages of the present invention will be further described and more readily apparent from the detailed description of the preferred embodiments which follows.

BRIEF DESCRIPTION OF THE DRAWINGS

The following detailed description of the preferred embodiments of the present invention can best be understood when read in conjunction with the following drawings, in which.

Figure 14:
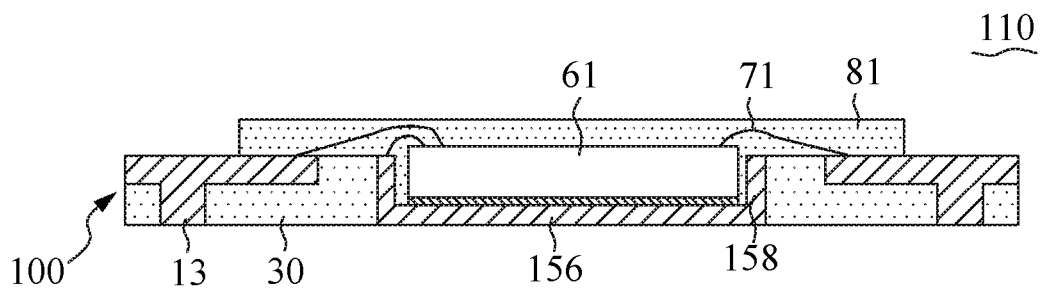
FIGS. 14, 15 and 16 are cross-sectional, top perspective and bottom perspective views, respectively, of a semiconductor assembly trimmed from the structure of FIGS. 12 and 13 in accordance with the first embodiment of the present invention.
Figure 42:
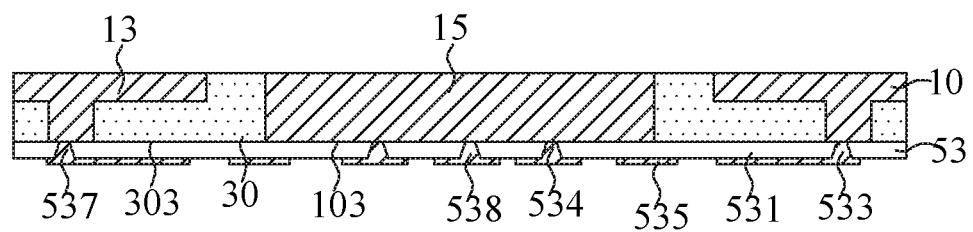
FIGS. 42 and 43 are cross-sectional and bottom perspective views, respectively, of the structure of FIGS. 40 and 41 further provided with a bottom patterned metal layer in accordance with the two embodiment of the present invention.
Figure 43:
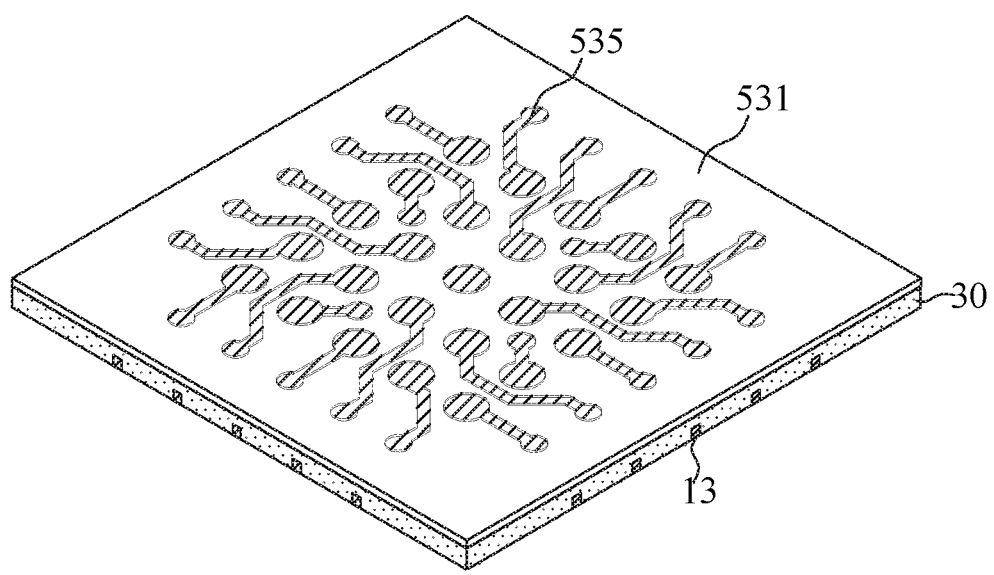
Figure 44:
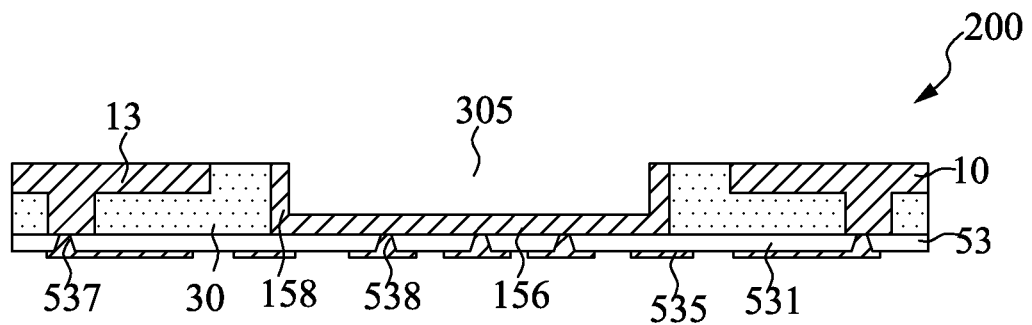
Figure 45:
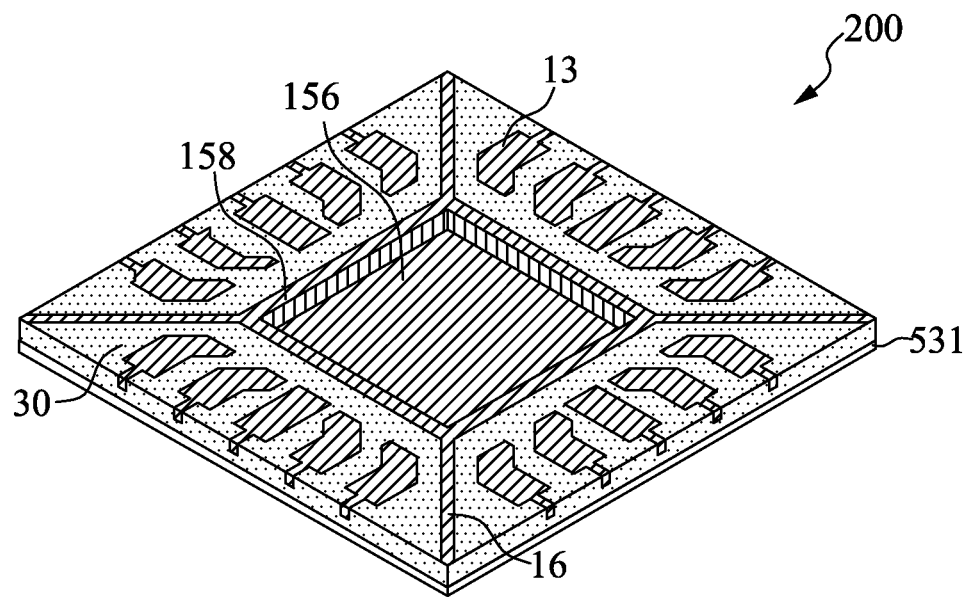
Figure 46:
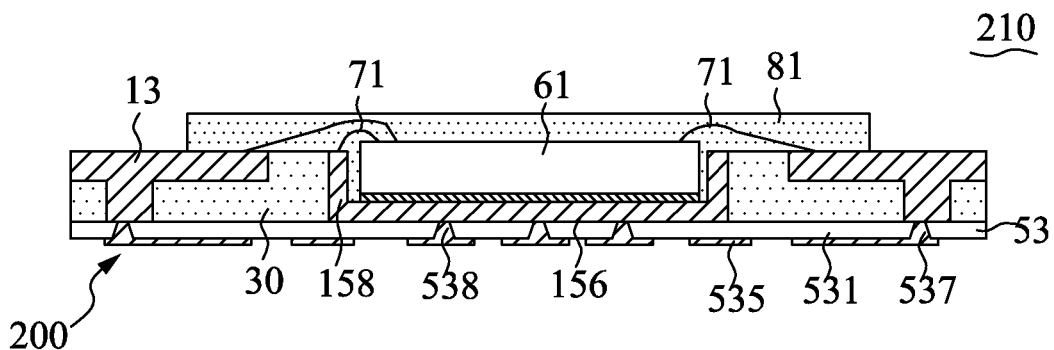
Figure 47:
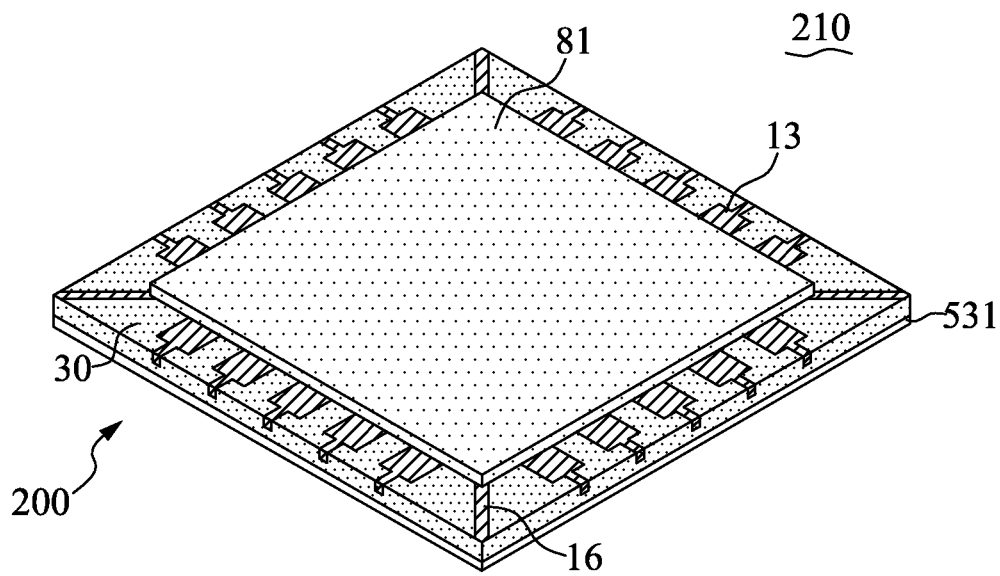
Figure 48:
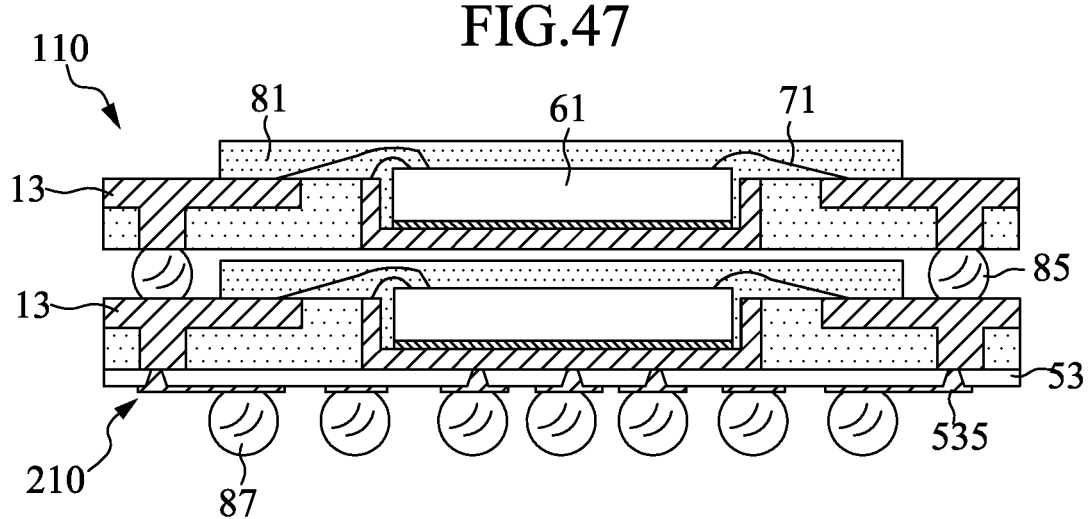
Figure 49:
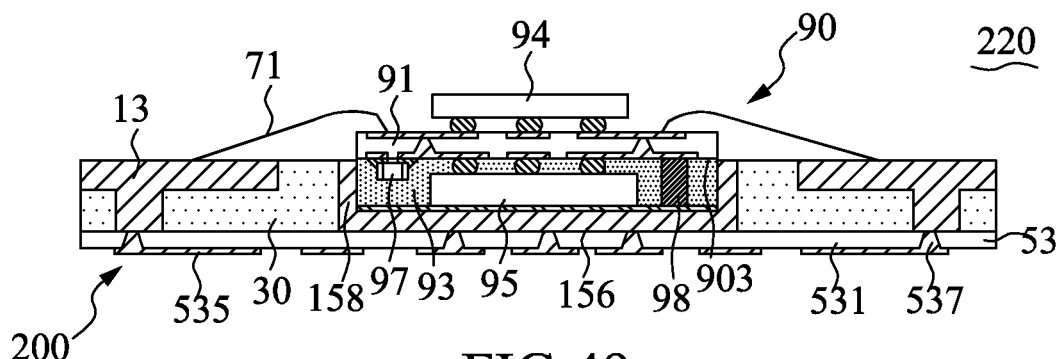
Figure 50:
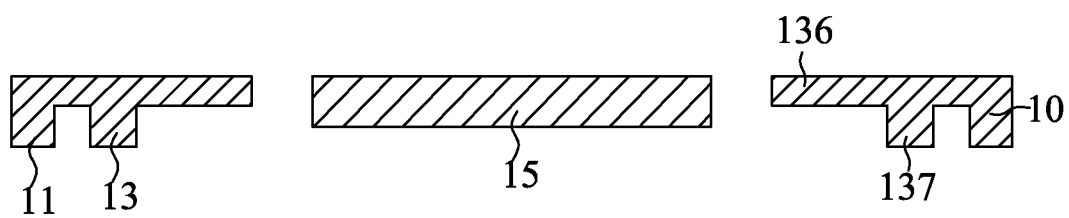
Figure 51:
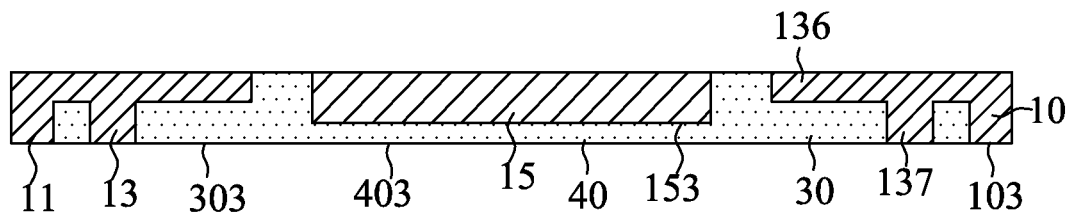
Figure 52:
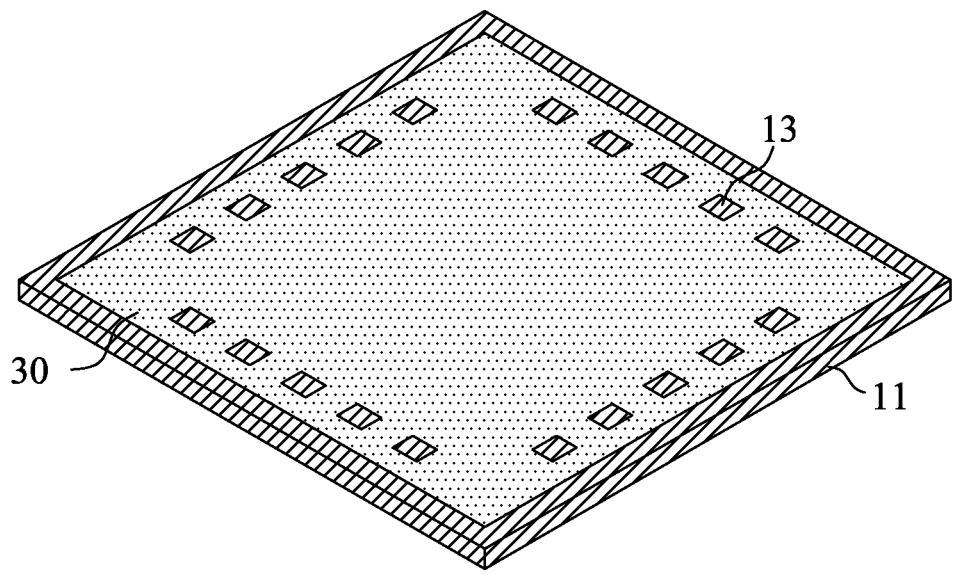
Figure 53:
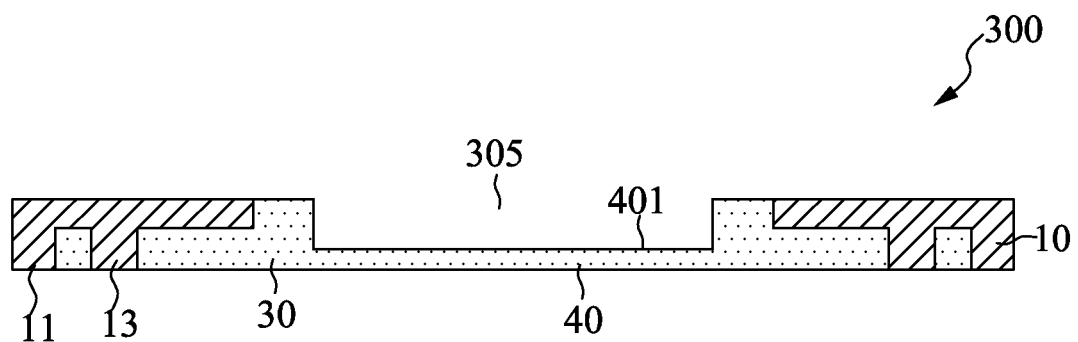
Figure 54:
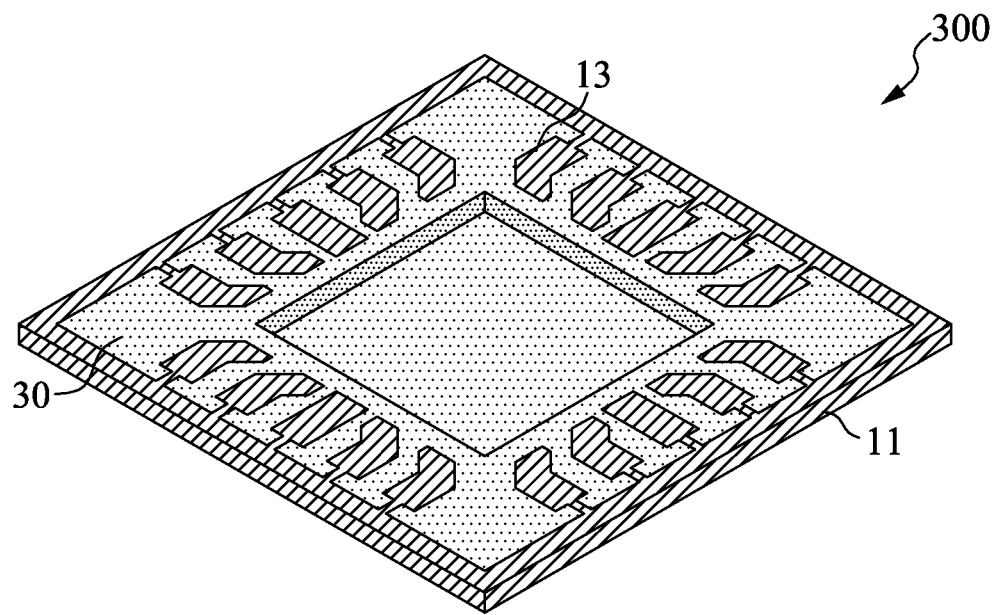
Figure 55:
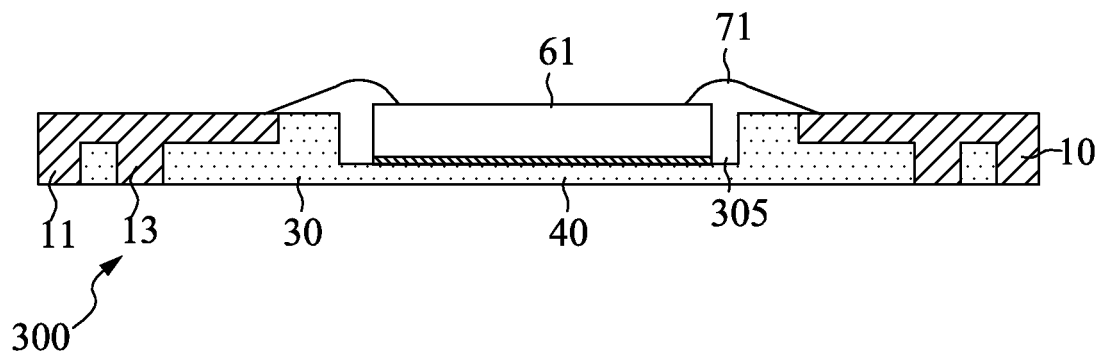
Figure 56:
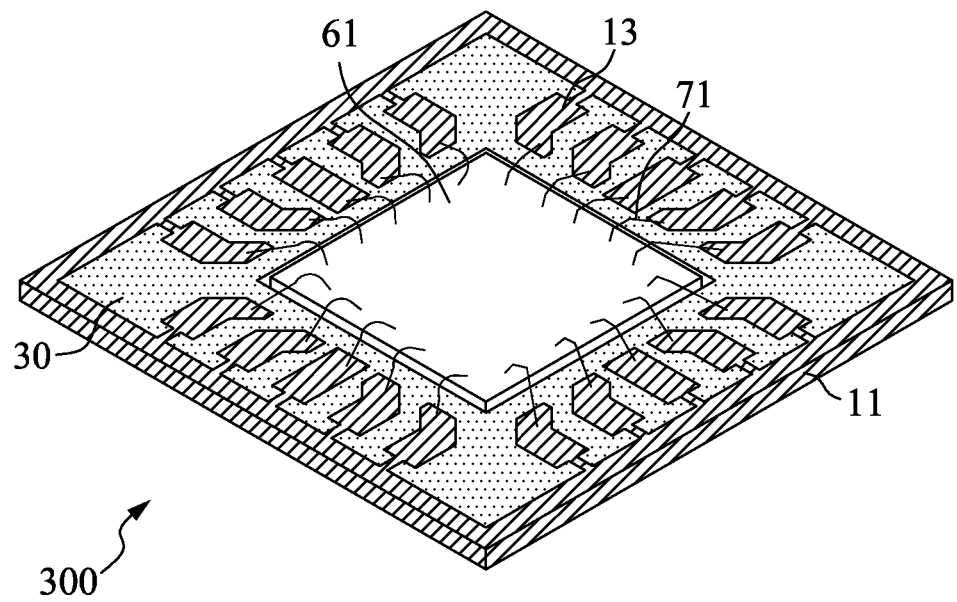
Figure 57:
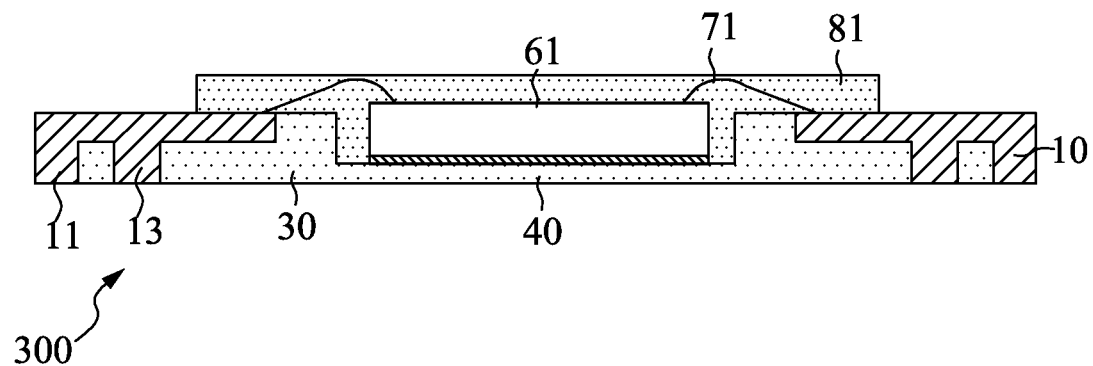
Figure 58:
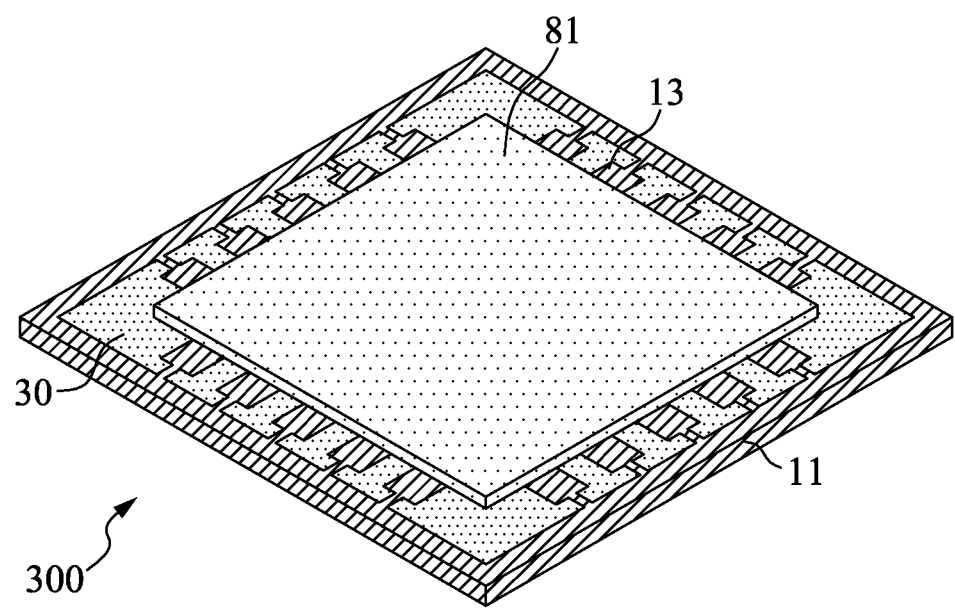
Figure 59:
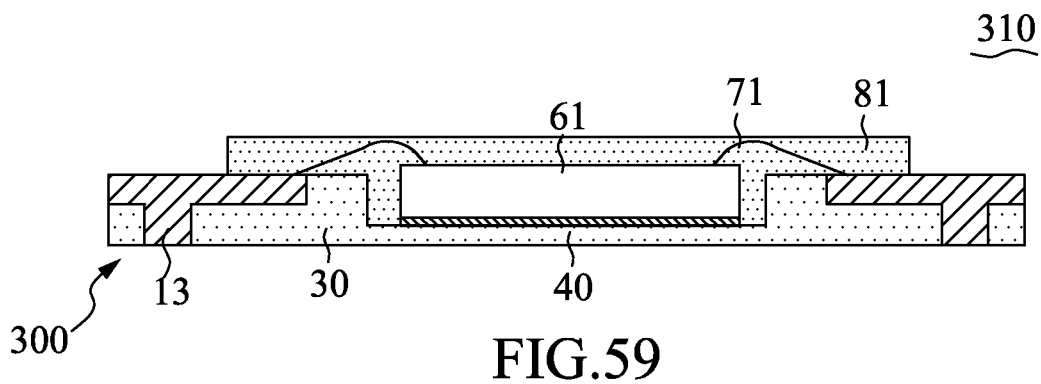
Figure 60:
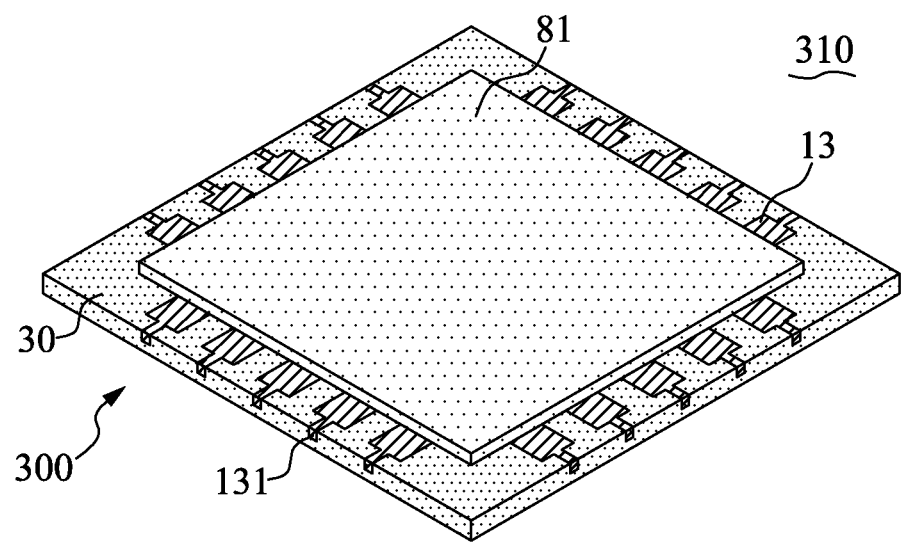
Figure 61:
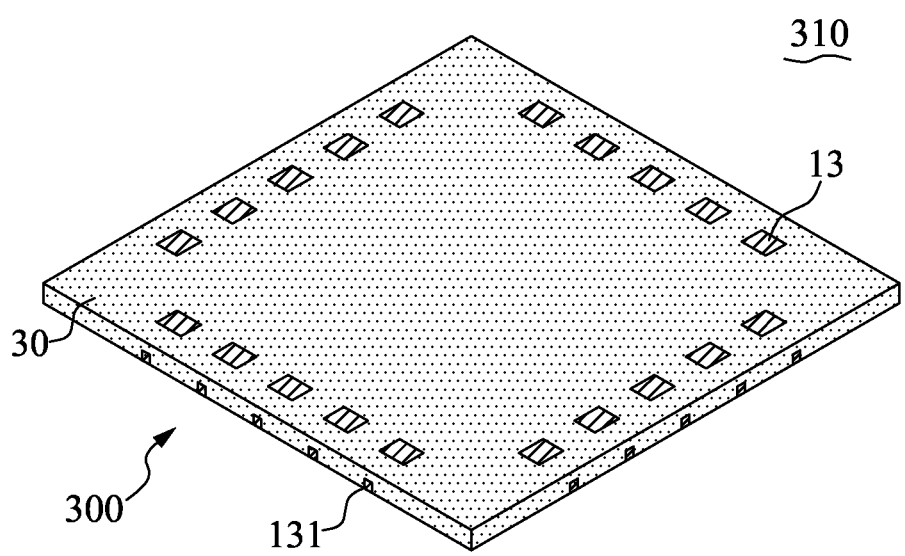
Figure 62:
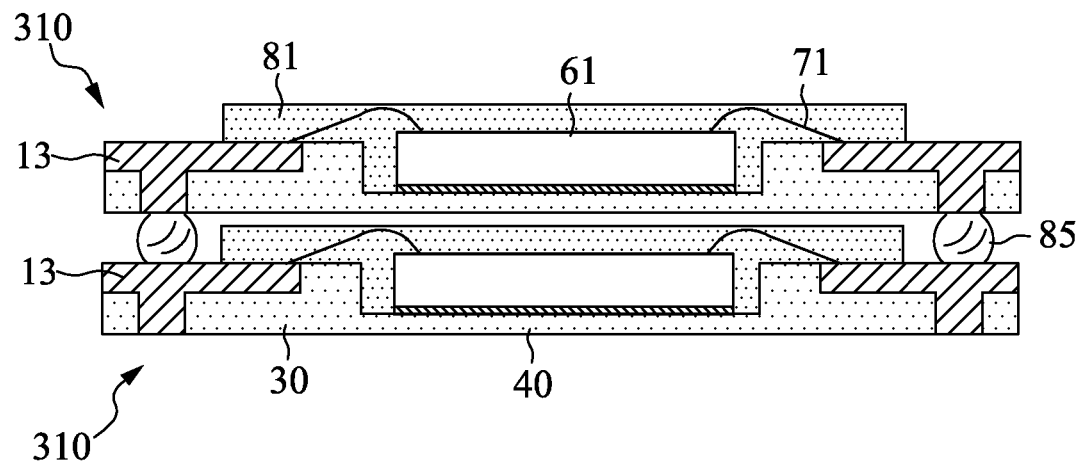
Figure 63:
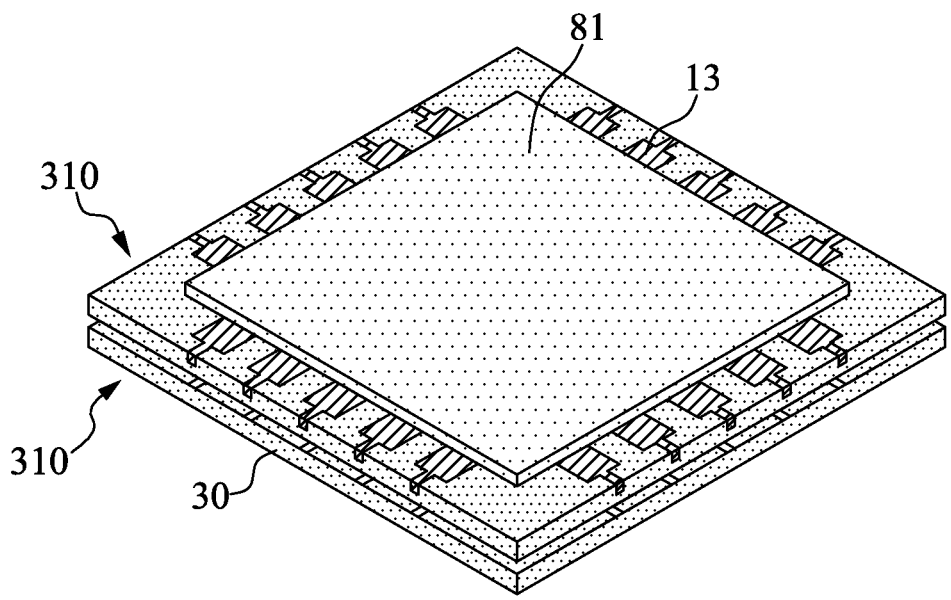
Figure 64:
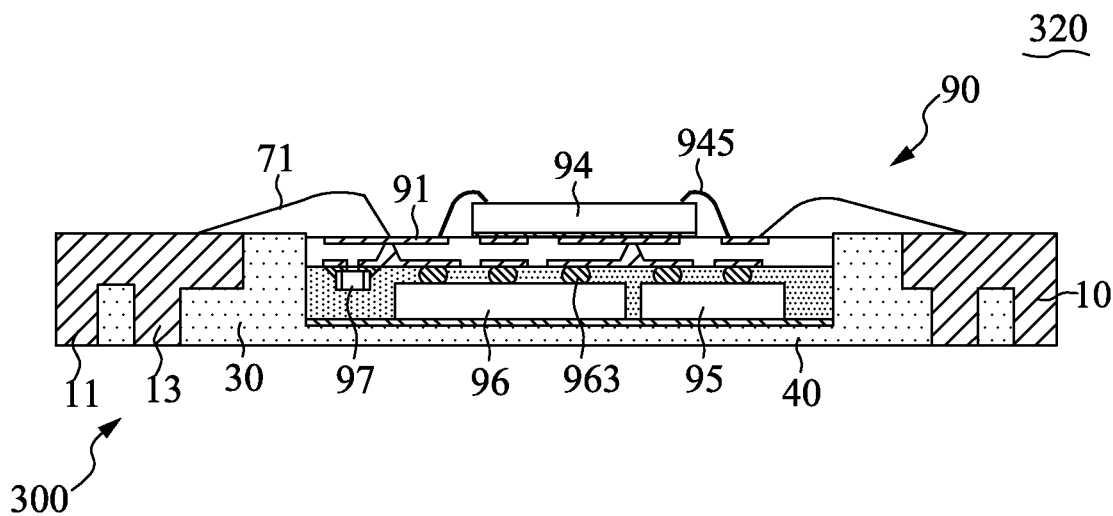
Figure 65:
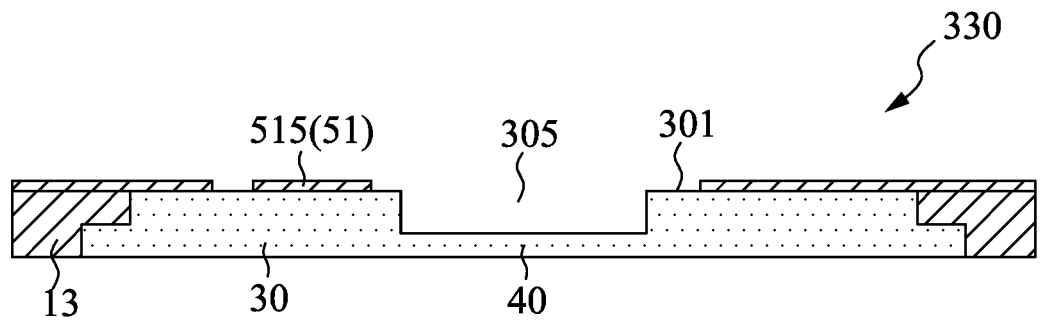
Figure 66:
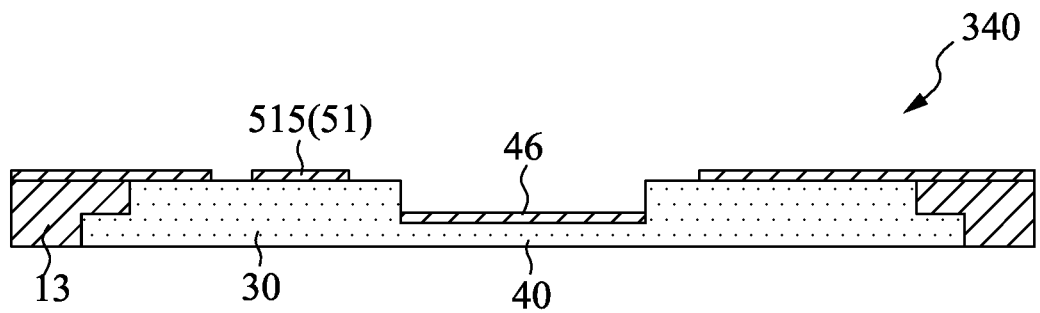
Figure 67:
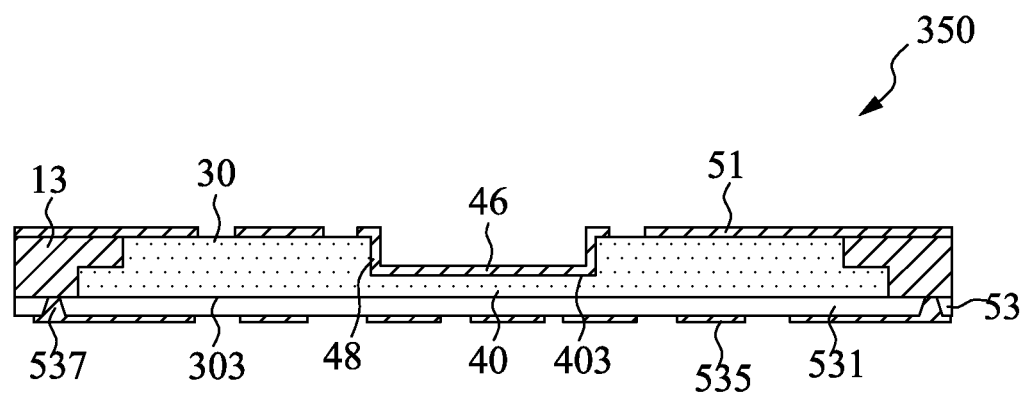
Figure 68:
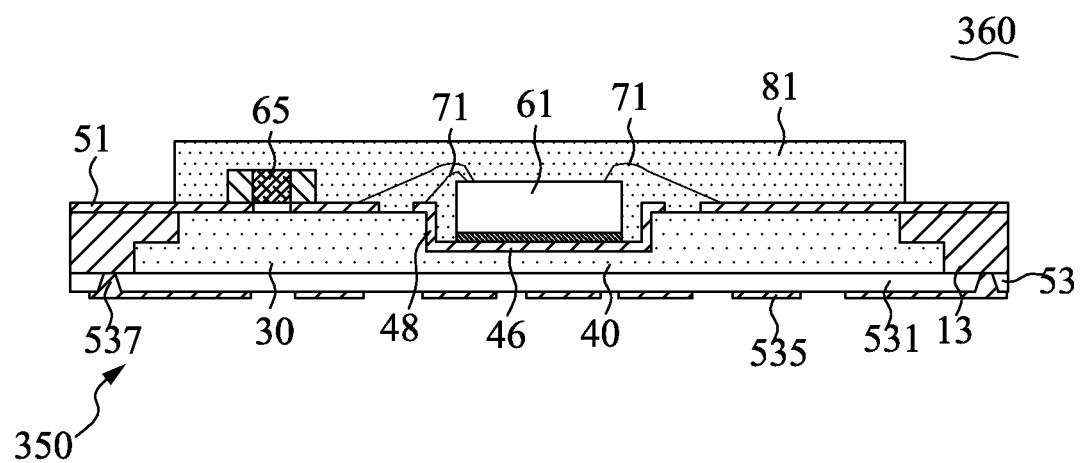

FIGS. 44 and 45 are cross-sectional and top perspective views, respectively, of the structure after selective etching of the textured metal sheet of FIGS. 42 and 43 to finish the fabrication of a wiring substrate in accordance with the second embodiment of the present invention;

FIGS. 46 and 47 are cross-sectional and top perspective views, respectively, of the structure of FIGS. 44 and 45 further provided with a semiconductor device, bonding wires and a molding compound in accordance with the second embodiment of the present invention;

FIG. 48 is a cross-sectional view of a three-dimensional stacked semiconductor package having the semiconductor assembly of FIG. 14 stacked on the semiconductor assembly of FIG. 46 in accordance with the second embodiment of the present invention;

FIG. 49 is a cross-sectional view of another semiconductor assembly having another aspect of the semiconductor device electrically coupled to the wiring substrate of FIG. 44 in accordance with the second embodiment of the present invention;

FIG. 50 is a cross-sectional view of a textured metal sheet in accordance with the third embodiment of the present invention;

FIGS. 51 and 52 are cross-sectional and bottom perspective views, respectively, of the structure of FIG. 50 further provided with a resin compound in accordance with the third embodiment of the present invention;

FIGS. 53 and 54 are cross-sectional and top perspective views, respectively, of the structure after selective etching of the textured metal sheet of FIGS. 51 and 52 to finish the fabrication of an untrimmed wiring substrate in accordance with the third embodiment of the present invention;

FIGS. 55 and 56 are cross-sectional and top perspective views, respectively, of the structure of FIGS. 53 and 54 further provided with a semiconductor device and bonding wires in accordance with the third embodiment of the present invention;

FIGS. 57 and 58 are cross-sectional and top perspective views, respectively, of the structure of FIGS. 55 and 56 further provided with a molding compound in accordance with the third embodiment of the present invention;

FIGS. 59, 60 and 61 are cross-sectional, top perspective and bottom perspective views, respectively, of a semiconductor assembly trimmed from the structure of FIGS. 57 and 58 in accordance with the third embodiment of the present invention;

FIGS. 62 and 63 are cross-sectional and top perspective views, respectively, of a three-dimensional stacked semiconductor package having two semiconductor assemblies of FIG. 59 in accordance with the third embodiment of the present invention;

FIG. 64 is a cross-sectional view of another semiconductor assembly having another aspect of the semiconductor device electrically coupled to the untrimmed wiring substrate of FIG. 53 in accordance with the third embodiment of the present invention;

FIG. 65 is a cross-sectional view of another aspect of the wiring substrate in accordance with the third embodiment of the present invention;

FIG. 66 is a cross-sectional view of yet another aspect of the wiring substrate in accordance with the third embodiment of the present invention;

FIG. 67 is a cross-sectional view of yet another aspect of the wiring substrate in accordance with the third embodiment of the present invention; and FIG. 68 is a cross-sectional view of the structure of FIG. 67 further provided with a semiconductor device, a passive component, bonding wires and a molding compound in accordance with the third embodiment of the present invention.

DETAILED DESCRIPTION OF THE PREFERRED EMBODIMENTS

Hereafter, examples will be provided to illustrate the embodiments of the present invention. Advantages and effects of the invention will become more apparent from the following description of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Embodiment 1

FIGS. 1-16 are schematic views showing a method of making a semiconductor assembly that includes a plurality of metal leads, a metal paddle, a metal film, a resin compound, a semiconductor device, a plurality of bonding wires and a molding compound in accordance with the first embodiment of the present invention.

Figure 1:
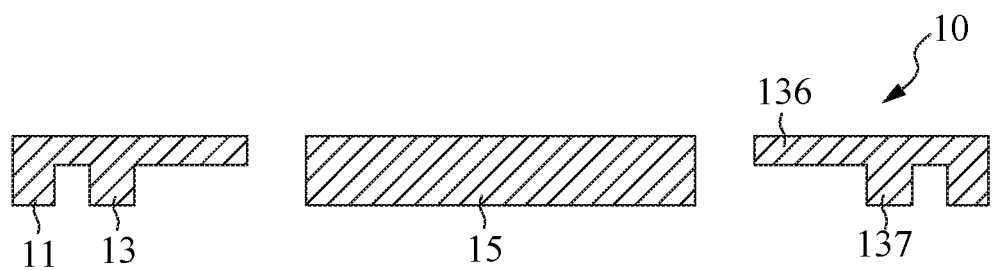
FIGS. 1, 2 and 3 are cross-sectional, top perspective and bottom perspective views, respectively, of a textured metal sheet in accordance with the first embodiment of the present invention.
Figure 2:
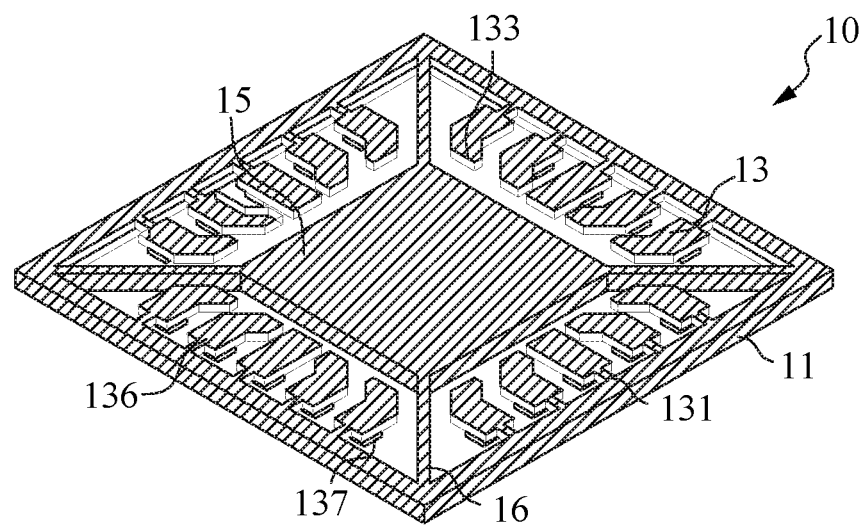
Figure 3:
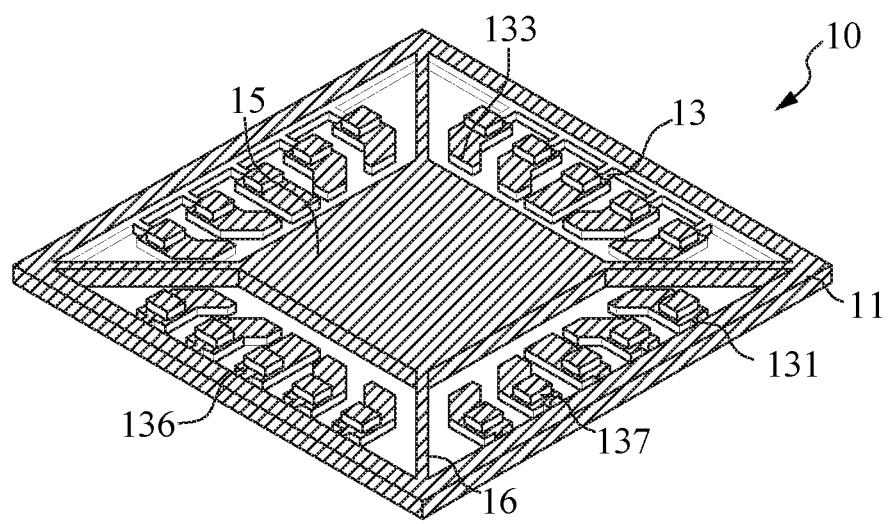

FIGS. 1, 2 and 3 are cross-sectional, top and bottom perspective views, respectively, of a textured metal sheet 10. The textured metal sheet 10 typically is made of copper alloys, steel or alloy 42, and can be formed by a wet etching or stamping/punching process from a rolled metal strip having a thickness in a range from about 0.15 mm to about 1.0 mm. The etching process may be a one-sided or two-sided etching to etch through the metal strip and thereby transfer the metal strip into a desired overall pattern of the textured metal sheet 10 that includes a metal frame 11, a plurality of metal leads 13, a metal slug 15 and a plurality of tie bars 16. The metal leads 13 laterally extend from the metal frame 11 toward the central area within the metal frame 11. As a result, the metal leads 13 each have an outer end 131 integrally connected to interior sidewalls of the metal frame 11 and an inner end 133 directed inwardly away from the metal frame 11. The metal slug 15 is located at the central area within the metal frame 11 and connected to the metal frame 11 by the tie bars 16. Additionally, in this embodiment, the textured metal sheet 10 is further selectively half-etched from its bottom side. Accordingly, the metal leads 13 have stepped peripheral edges. The metal leads 13 each have a horizontally elongated portion 136 and a vertically projected portion 137. The vertically projected portion 137 protrudes from a lower surface of the horizontally elongated portion 136 in the downward direction.

Figure 4:
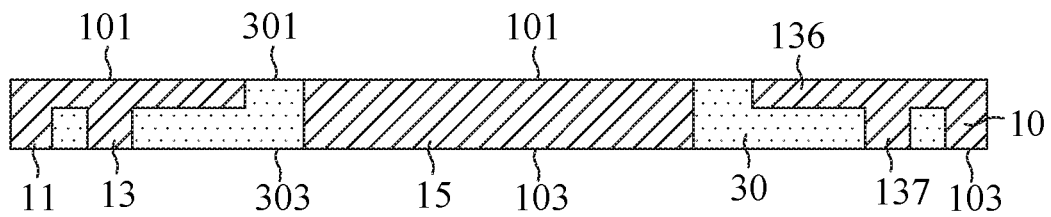
FIGS. 4, 5 and 6 are cross-sectional, top perspective and bottom perspective views, respectively, of the structure of FIGS. 1, 2 and 3 further provided with a resin compound in accordance with the first embodiment of the present invention.
Figure 5:
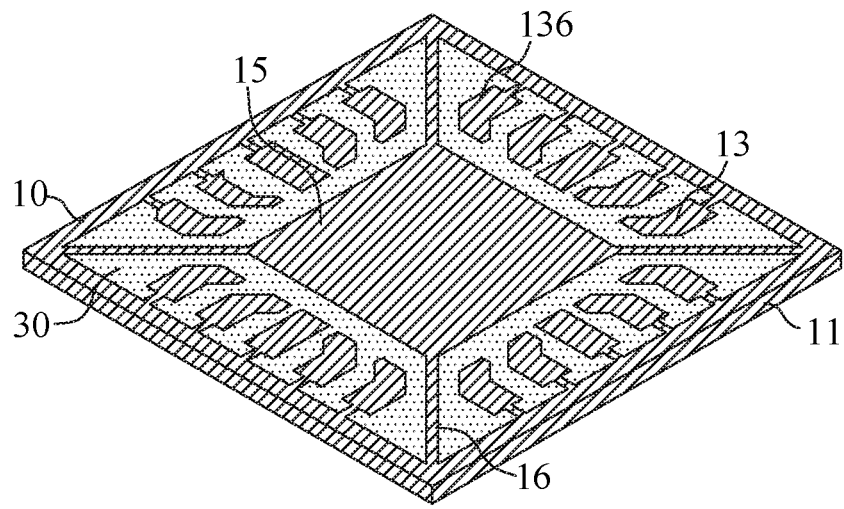
Figure 6:
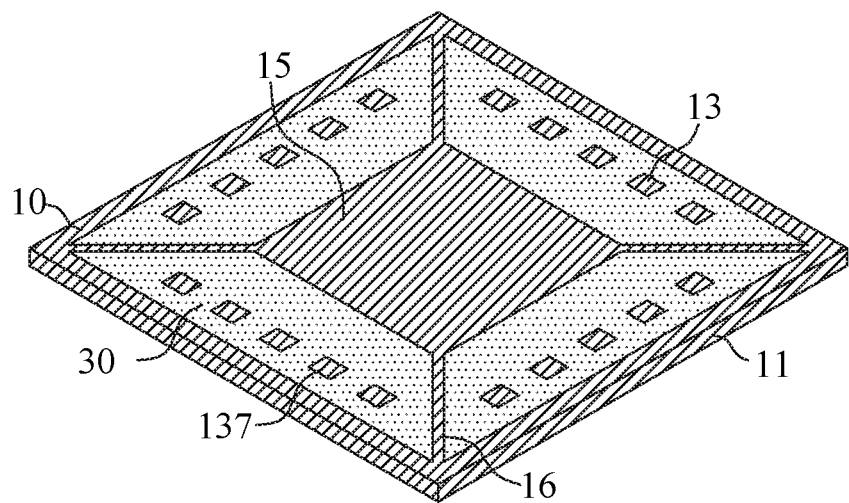

FIGS. 4, 5 and 6 are cross-sectional, top and bottom perspective views, respectively, of the structure provided with a resin compound 30. The resin compound 30 can be deposited by applying a resin material into the remaining spaces within the metal frame 11. The resin material can be applied by paste printing, compressive molding, transfer molding, liquid injection molding, spin coating, or other suitable methods. Then, a thermal process (or heat-hardened process) is applied to harden the resin material and to transform it into a solid molding compound. As a result, the resin compound 30 covers the lower surfaces of the horizontally elongated portions 136 as well as sidewalls of the vertically projected portions 137 and sidewalls of the metal slug 15. By the stepped cross-section profile of the metal leads 13, the resin compound 30 can securely interlock with the metal leads 13 so as to prevent the metal leads 13 from being vertically forced apart from the resin compound 30 and also to avoid micro-cracking at the interface along the vertical direction. In this illustration, the top surface 301 of the resin compound 30 is substantially coplanar with the top sides 101 of the metal leads 13 and the metal slug 15, whereas the bottom surface 303 of the resin compound 30 is substantially coplanar with the bottom sides 103 of the metal leads 13 and the metal slug 15 by planarization.

The resin compound 30 typically includes binder resins, fillers, hardeners, diluents, and additives. There is no particular limit to the binder resin that can be used in accordance with the present invention. For example, the binder resin may be at least one selected from the group consisting of an epoxy resin, a phenol resin, a polyimide resin, a polyurethane resin, a silicone resin, a polyester resin, an acrylate, bismaleimide (BMI), and equivalents thereof. The binder resin provides intimate adhesion between an adherent and the filler. The binder resin also serves to elicit thermal conductivity through chain-like connection of the filler. The binder resin may also improve physical and chemical stability of the molding compound.

Additionally, there is no particular limit to the filler that can be used in accordance with the present invention. For example, a thermally conductive filler may be selected from the group consisting of aluminum oxide, aluminum nitride, silicon carbide, tungsten carbide, boron carbide, silica and equivalents thereof. More specifically, the resin compound 30 may become thermally conductive or have low CTE if suitable fillers are dispersed therein. For example, aluminum nitride (AlN) or silicon carbide (SiC) has relatively high thermal conductivity, high electrical resistance, and a relatively low coefficient of thermal expansion (CTE). Accordingly, when the resin compound 30 employs these kinds of materials as fillers, the resin compound 30 would exhibit improved heat dissipation performance, electrical isolation performance and show inhibition of delamination or cracking of circuitry or interfaces due to low CTE. The maximum particle size of the thermally conductive filler may be 25 μm or less. The content of the filler may be in the range of 10 to 90% by weight. If the content of the thermally conductive filler is less than 10% by weight, this may result in insufficient thermal conductivity and excessively low viscosity. Low viscosity means that it may be difficult to handle and control the process due to excessively easy outflow of the resin from the tool during dispensing or molding process. On the other hand, if the content of the filler is higher than 90% by weight, this may result in decreased adhesive strength and excessively high viscosity of the molding material. High viscosity of the molding material results in poor workability due to no outflow of the material from the tool during the dispensing or molding process. Additionally, the resin compound 30 may include more than one type of fillers. For example, the second filler may be polytetrafluoroethylene (PTFE) so as to further improve electrical isolation property of the resin compound 30. In any case, the resin compound 30 preferably has an elastic modulus larger than 1.0 GPa and a linear coefficient of thermal expansion in a range from about $5 \times 10^{-6} K^{-1}$ to about $15 \times 10^{-6} K^{-1}$.

Figure 7:
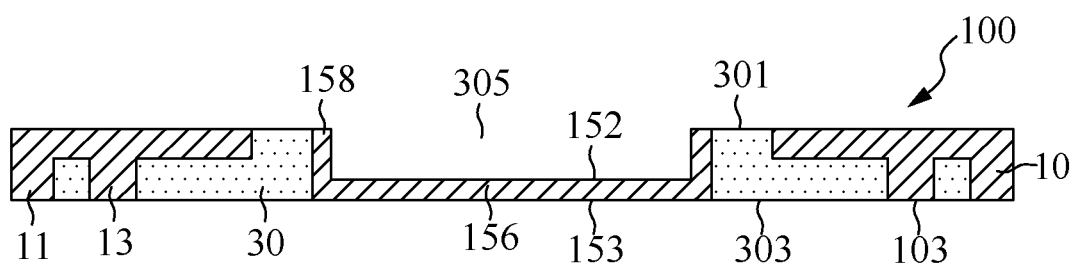
FIGS. 7, 8 and 9 are cross-sectional, top perspective and bottom perspective views, respectively, of the structure after selective etching of the textured metal sheet of FIGS. 4, 5 and 6 to finish the fabrication of an untrimmed wiring substrate in accordance with the first embodiment of the present invention.
Figure 8:
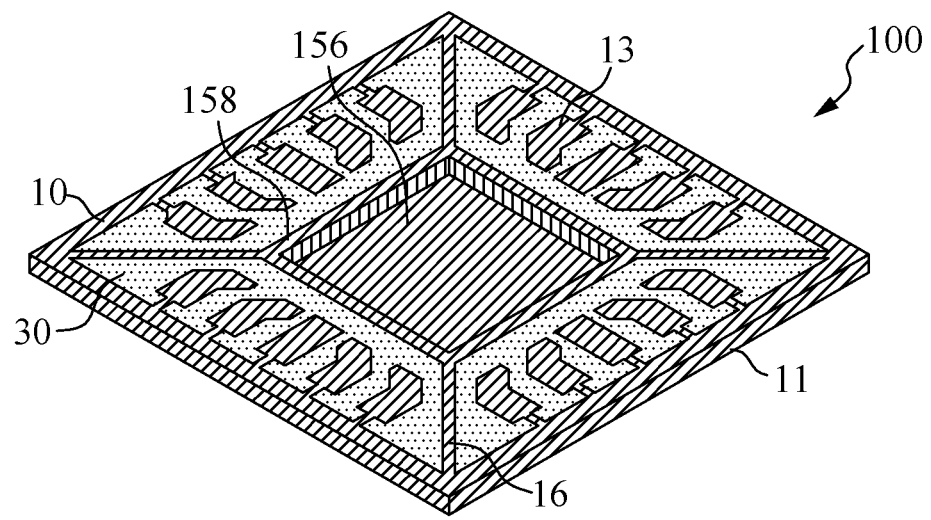
Figure 9:
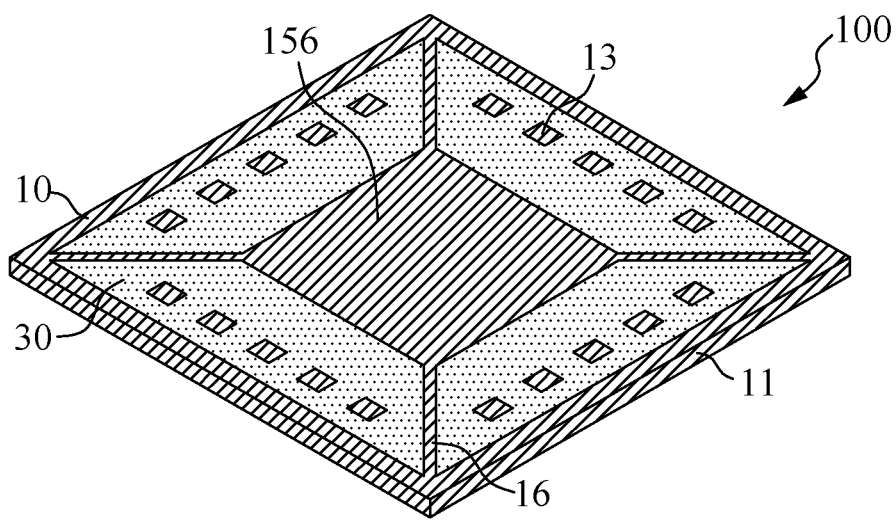

FIGS. 7, 8 and 9 are cross-sectional, top and bottom perspective views, respectively, of the structure after selective removal of the metal slug 15. The metal slug 15 can be selectively removed by numerous techniques, such as wet chemical etching, electro-chemical etching or laser, to form a cavity 305 that has an entrance at the top surface 301 of the resin compound 30. The remaining portion of the metal slug 15 consists of a metal paddle 156 and a metal film 158. The metal paddle 156 has a top surface 152 as a bottom of the cavity 305 and a bottom surface 153 substantially coplanar with the bottom surface 303 of the resin compound 30 and the bottom sides 101 of the metal leads 13. The metal film 158 is disposed on an interior sidewall surface of the resin compound 30 and integral with the metal paddle 156 and laterally surrounds the cavity 305. At this stage, an untrimmed wiring substrate 100 is accomplished and includes the metal frame 11, the metal leads 13, the metal paddle 156, the metal film 158, the tie bars 16 and the resin compound 30.

Figure 10:
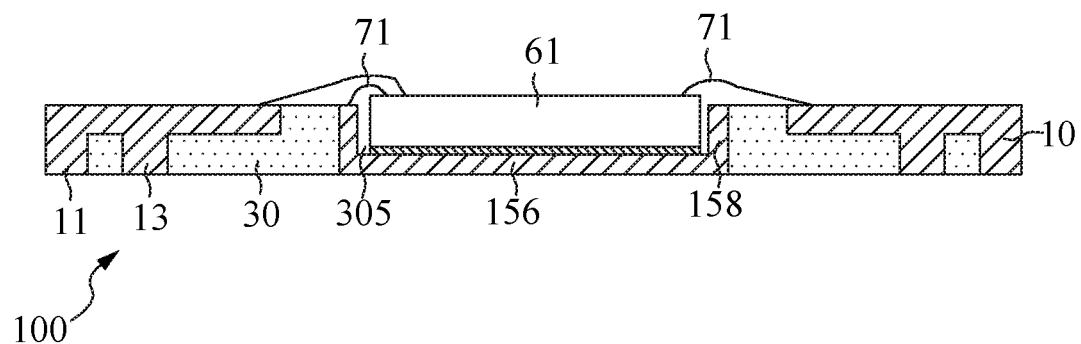
FIGS. 10 and 11 are cross-sectional and top perspective views, respectively, of the structure of FIGS. 7 and 8 further provided with a semiconductor device and bonding wires in accordance with the first embodiment of the present invention.
Figure 11:
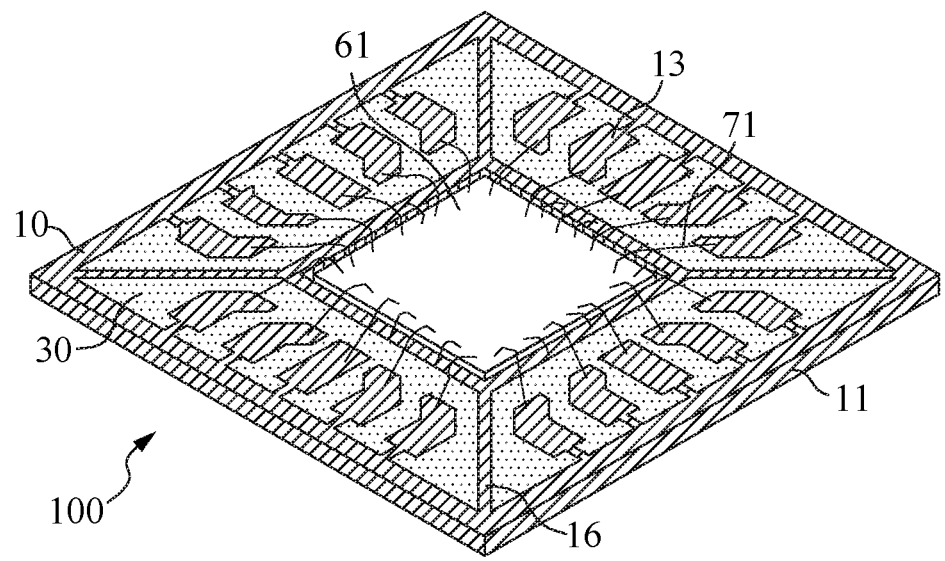

FIGS. 10 and 11 are cross-sectional and top perspective views, respectively, of the structure with a semiconductor device 61 electrically coupled to the wiring substrate 100. The semiconductor device 61, illustrated as a chip, is face-up disposed in the cavity 305 and attached on the metal paddle 156 and electrically coupled to the metal leads 13 and the metal film 158 through bonding wires 71. As a result, the semiconductor device 61 can be thermally conductible to the metal paddle 156 and electrically coupled to the metal leads 13 for signal routing and to the metal film 158 for ground connection through the bonding wires 71 electrically connecting the semiconductor device 61 to the metal leads 13 and the metal film 158 typically by gold or copper ball bonding, or gold or aluminum wedge bonding.

Figure 12:
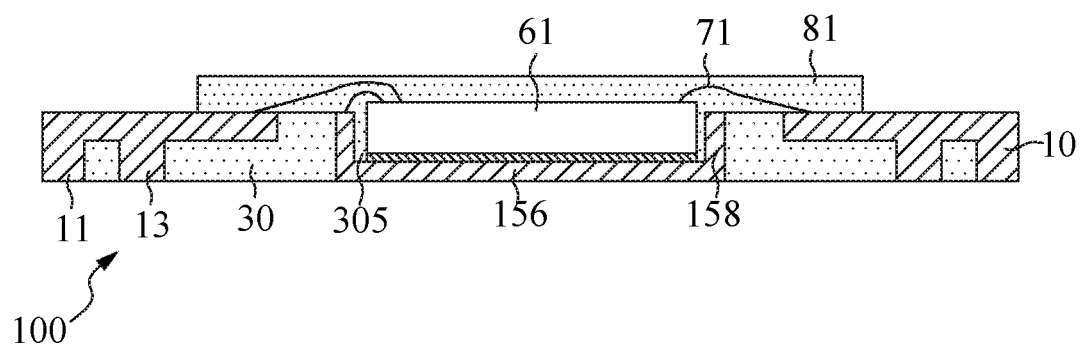
FIGS. 12 and 13 are cross-sectional and top perspective views, respectively, of the structure of FIGS. 10 and 11 further provided with a molding compound in accordance with the first embodiment of the present invention.
Figure 13:
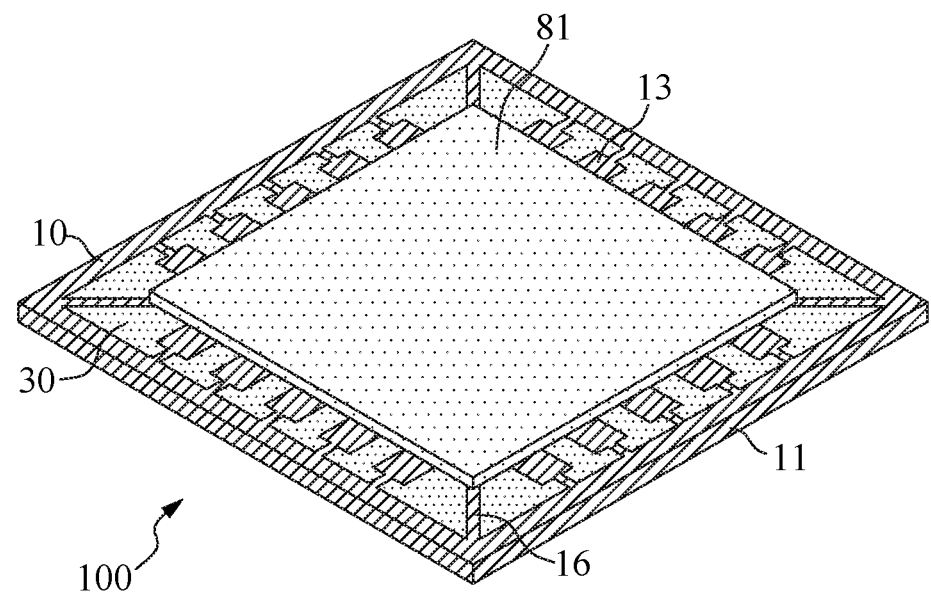

FIGS. 12 and 13 are cross-sectional and top perspective views, respectively, of the structure provided with a molding compound 81. Optionally, the molding compound 81 may be further provided to cover and encapsulate the semiconductor device 61 and the bonding wires 71 from above, and further extends into gaps between the semiconductor device 61 and interior sidewalls of the cavity 305.

Figure 15:
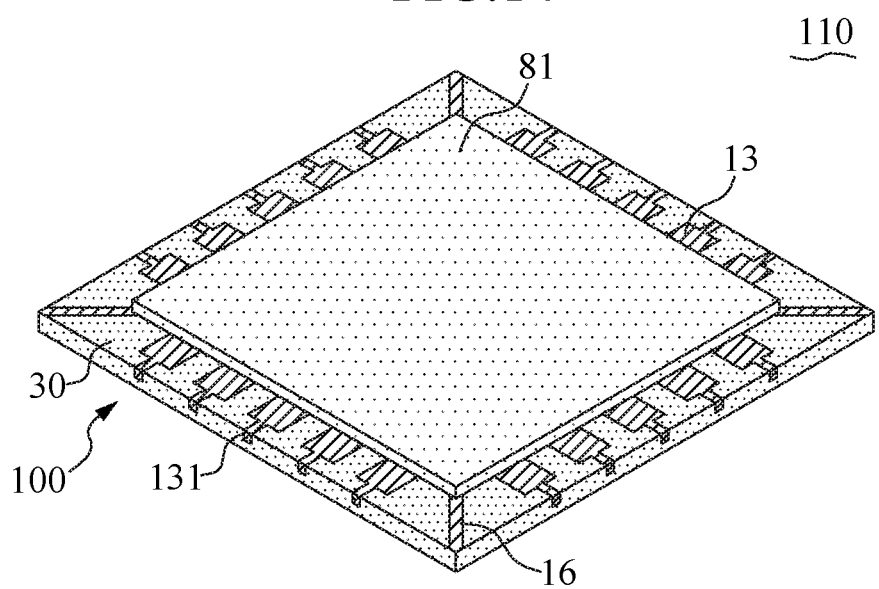
Figure 16:
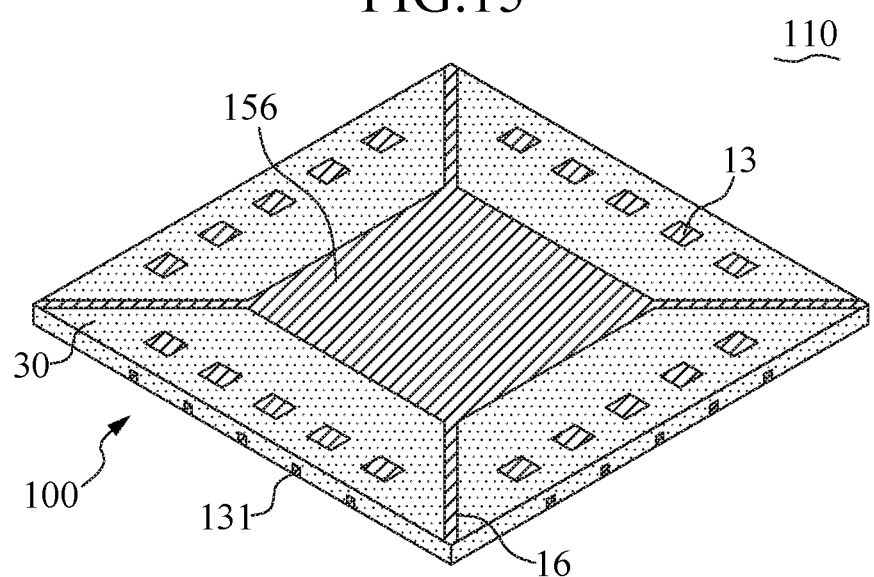

FIGS. 14, 15 and 16 are cross-sectional, top and bottom perspective views, respectively, of a semiconductor assembly 110 after removal of the metal frame 11. Removal of the metal frame 11 can be done by various methods including chemical etching, mechanical trimming/cutting or sawing to separate the metal frame 11 from the outer ends 131 of the metal leads 13. As a result, the outer ends 131 of the metal leads 13 are situated at peripheral edges of the trimmed wiring substrate 100 and have a lateral surface flush with peripheral edges of the resin compound 30.

Figure 17:
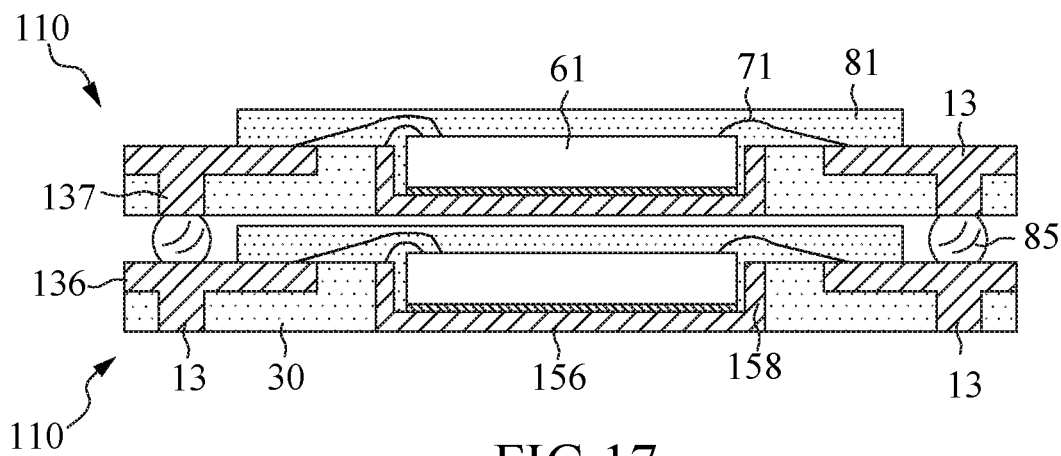
FIGS. 17 and 18 are cross-sectional and top perspective views, respectively, of a three-dimensional stacked semiconductor package having two semiconductor assemblies of FIG. 14 in accordance with the first embodiment of the present invention.
Figure 18:
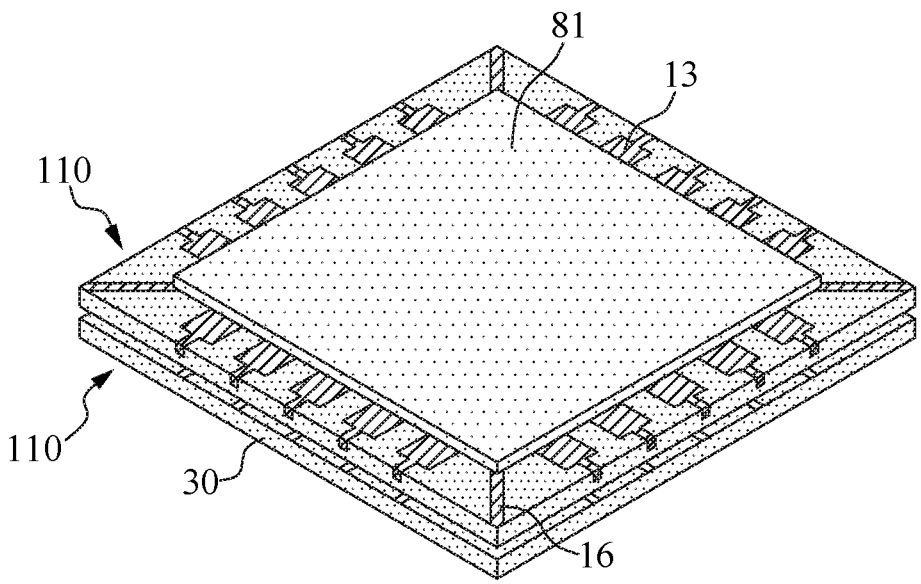

FIGS. 17 and 18 are cross-sectional and top perspective views, respectively, of a three-dimensional stacked semiconductor package having two semiconductor assemblies 110 of FIG. 14 electrically connected to each other by solder balls 85. The upper semiconductor assembly 110 is stacked on and electrically coupled to the lower semiconductor assembly 110 by solder balls 85 in contact with the vertically projected portions 137 of the metal leads 13 of the upper semiconductor assembly 110 and the horizontally elongated portions 136 of the metal leads 13 of the lower semiconductor assembly 110.

Figure 19:
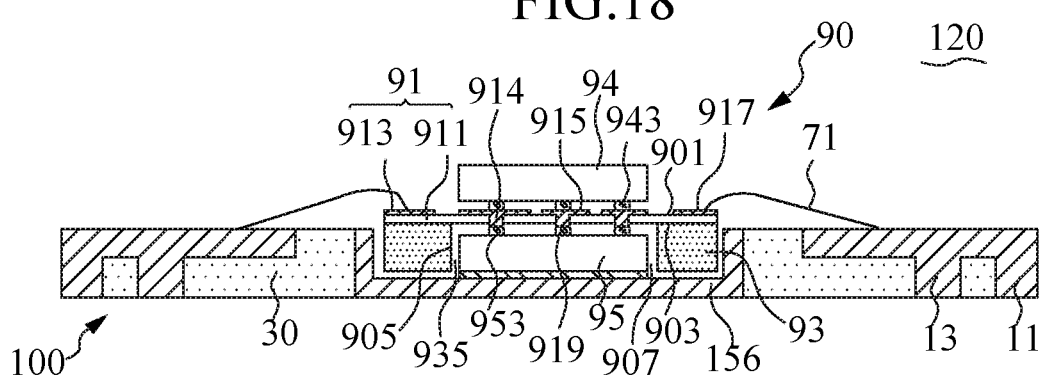
FIG. 19 is a cross-sectional view of another semiconductor assembly having another aspect of the semiconductor device electrically coupled to the untrimmed wiring substrate of FIG. 7 in accordance with the first embodiment of the present invention.

FIG. 19 is a cross-sectional view of another semiconductor assembly 120 having a semiconductor device 90 electrically coupled to the wiring substrate 100 of FIG. 7. The semiconductor device 90 includes a routing circuitry 91, a stiffener 93, a first chip 94 and a second chip 95. The routing circuitry 91 is illustrated as a multi-layered buildup circuitry and includes a dielectric layer 911 and wiring layer 913. The dielectric layer 911 typically has a thickness of 50 microns, and can be made of epoxy resin, glass-epoxy, polyimide, or the like. The wiring layer 913 typically is made of copper and extends laterally on the dielectric layer 911 and includes conductive vias 914 extending through the dielectric layer 911. In this illustration, the routing circuitry 91 provides first conductive pads 915 and terminal pads 917 at the top surface 901 and second conductive pads 919 at the bottom surface 903. The terminal pads 917 have larger pad size and pitch than those of first conductive pads 915, and the second conductive pads 919 are exposed by an aperture 935 of the stiffener 93 on the bottom surface 903 of the routing circuitry 91. The stiffener 93 may be made of resin, ceramic, metal, composites of metal, or a single or multi-layer circuitry structure which has enough mechanical robustness, and provides mechanical support for the routing circuitry 91. The first chip 94 is electrically coupled to the top surface 901 of the routing circuitry 91, whereas the second chip 95 is disposed in a cavity 907 formed by the bottom surface 903 of the routing circuitry 91 and the interior sidewalls 905 of the aperture 935 of the stiffener 93 and electrically coupled to the bottom surface 909 of the routing circuitry 91. In this embodiment, the first chip 94 is electrically coupled to the first conductive pads 915 of the routing circuitry 91 through first conductive bumps 943, whereas the second chip 95 is electrically coupled to the second conductive pads 919 of the routing circuitry 91 through second conductive bumps 953 and attached to the paddle layer 156. The routing circuitry 91 is electrically connected to the wiring substrate 100 by bonding wires 71 attached to terminal pads 917 of the routing circuitry 91 and the metal leads 13 of the wiring substrate 100. As a result, the first chip 94 and the second chip 95 are electrically connected to each other by the routing circuitry 91, and further electrically connected to the wiring substrate 100 through the bonding wires 71.

Figure 20:
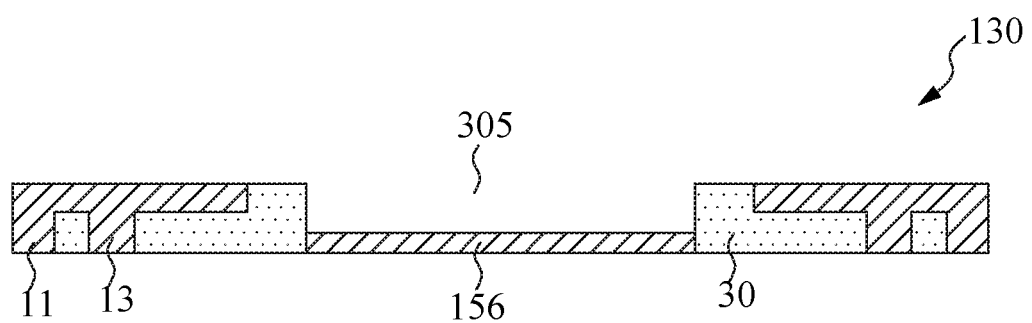
FIGS. 20 and 21 are cross-sectional and top perspective views, respectively, of another aspect of the untrimmed wiring substrate in accordance with the first embodiment of the present invention.
Figure 21:
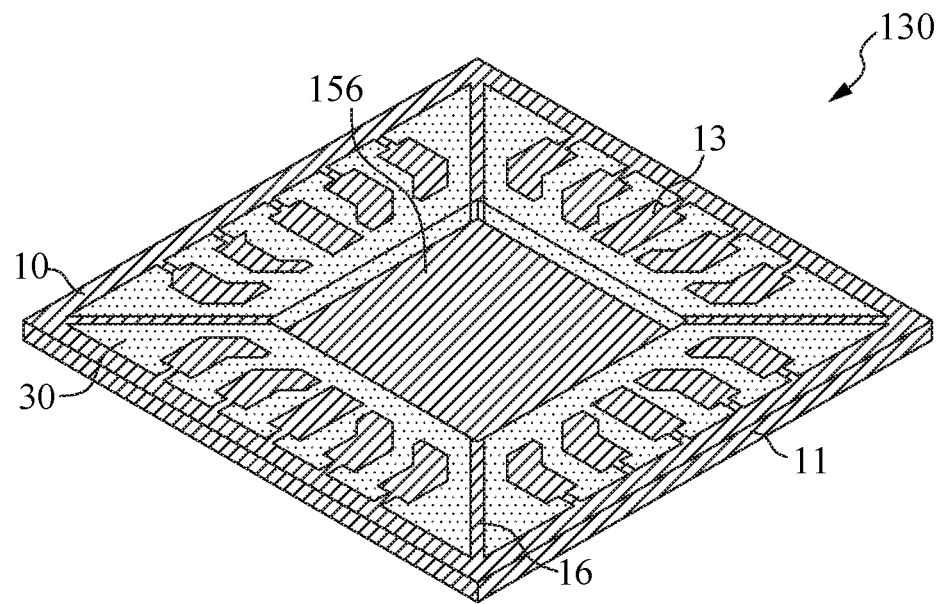

FIGS. 20 and 21 are cross-sectional and top perspective views, respectively, of another aspect of the untrimmed wiring substrate according to the first embodiment of the present invention. The untrimmed wiring substrate 130 is similar to that illustrated in FIGS. 7-9, except that it includes no metal film on interior sidewall surfaces of the resin compound 30. As a result, the cavity 305 is formed by the top surface of the metal paddle 156 and the interior sidewall surface of the resin compound 30.

Figure 22:
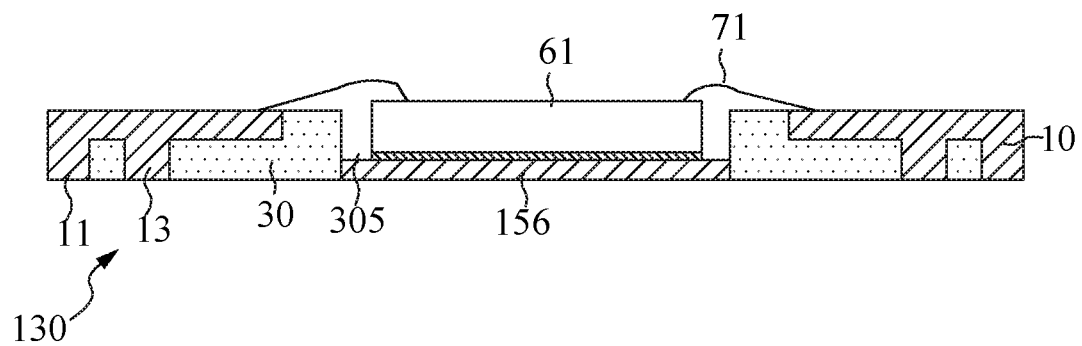
FIGS. 22 and 23 are cross-sectional and top perspective views, respectively, of the structure of FIGS. 20 and 21 further provided with a semiconductor device and bonding wires in accordance with the first embodiment of the present invention.
Figure 23:
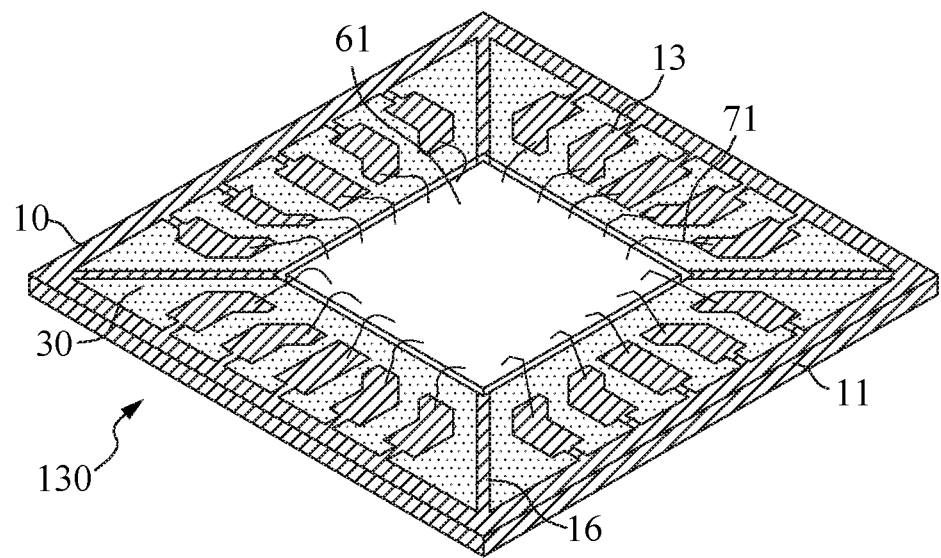

FIGS. 22 and 23 are cross-sectional and top perspective views, respectively, of the structure with a semiconductor device 61 electrically coupled to the wiring substrate 130. The semiconductor device 61 is face-up disposed in the cavity 305 and attached on the metal paddle 156 and electrically coupled to the metal leads 13 of the through bonding wires 71.

Figure 24:
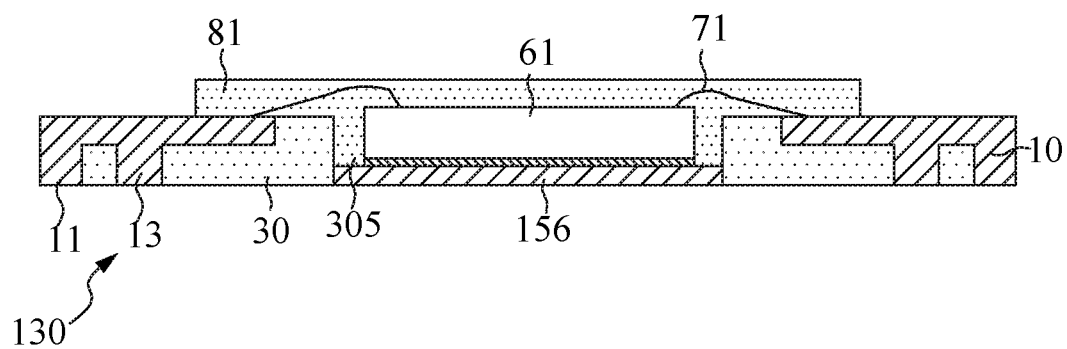
FIGS. 24 and 25 are cross-sectional and top perspective views, respectively, of the structure of FIGS. 22 and 23 further provided with a molding compound in accordance with the first embodiment of the present invention.
Figure 25:
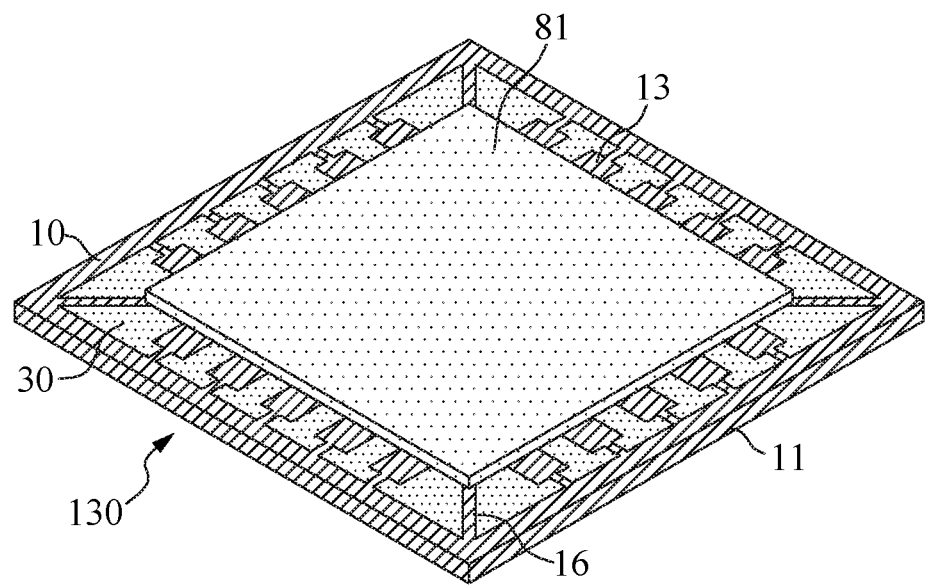

FIGS. 24 and 25 are cross-sectional and top perspective views, respectively, of the structure provided with a molding compound 81. Optionally, the molding compound 81 may be further provided to cover and encapsulate the semiconductor device 61 and the bonding wires 71 from above, and further extends into gaps between the semiconductor device 61 and interior sidewalls of the cavity 305.

Figure 26:
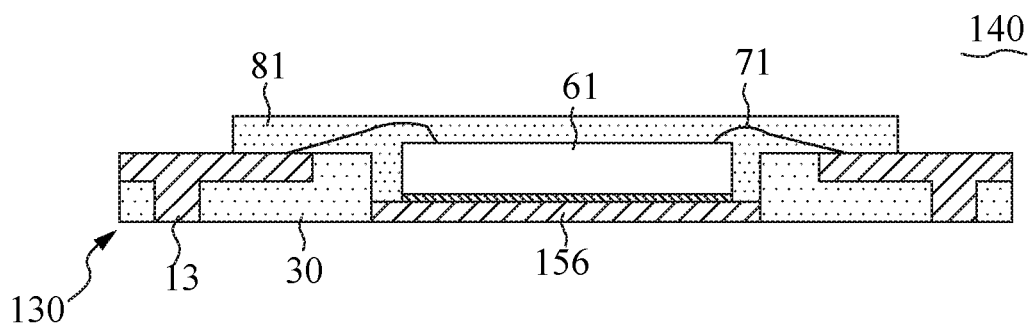
FIGS. 26, 27 and 28 are cross-sectional, top perspective and bottom perspective views, respectively, of a semiconductor assembly trimmed from the structure of FIGS. 24 and 25 in accordance with the first embodiment of the present invention.
Figure 27:
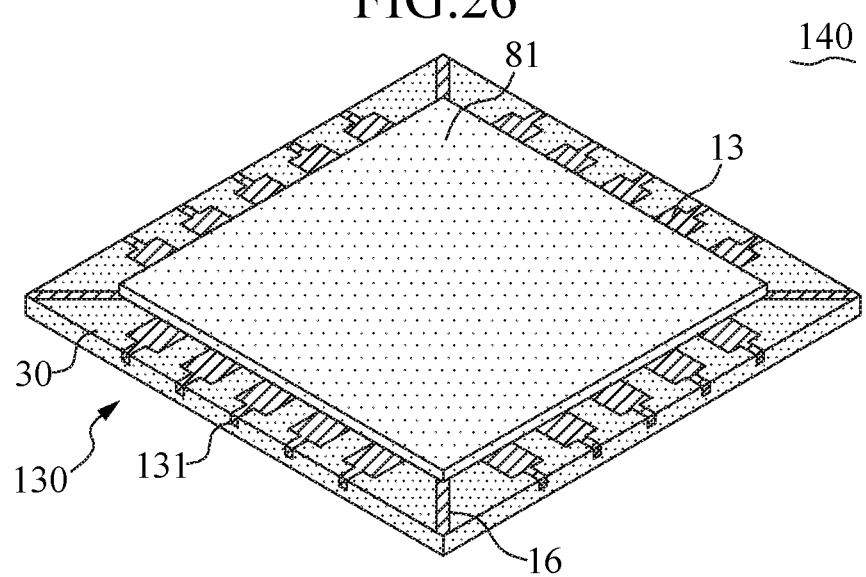
Figure 28:
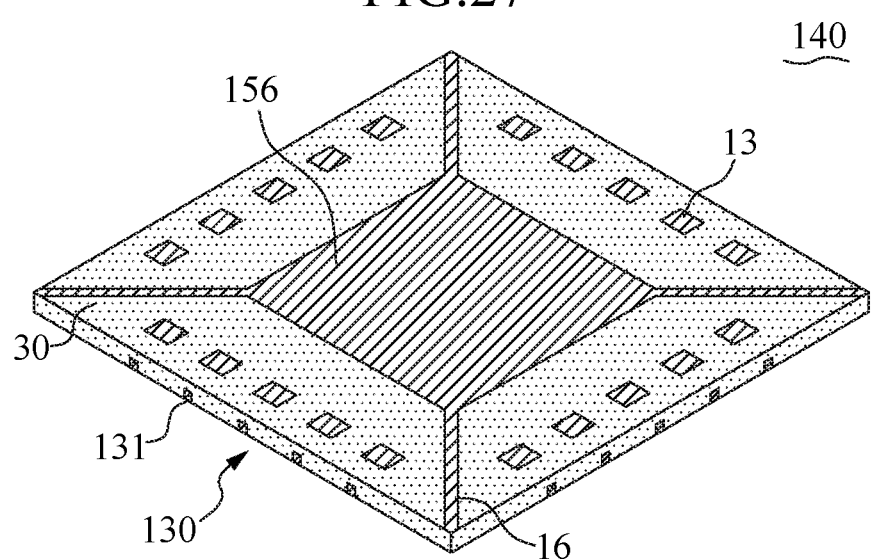

FIGS. 26, 27 and 28 are cross-sectional, top and bottom perspective views, respectively, of a semiconductor assembly 140 after removal of the metal frame 11. Removal of the metal frame 11 can be done by various methods including chemical etching or mechanical trimming/cutting and sawing. By separating the metal frame 11, the connection between the outer ends 131 of the metal leads 13 is broken. As a result, the wiring substrate 130 includes the metal leads 13, the metal paddle 156, the tie bars 16 and the resin compound 30.

Figure 29:
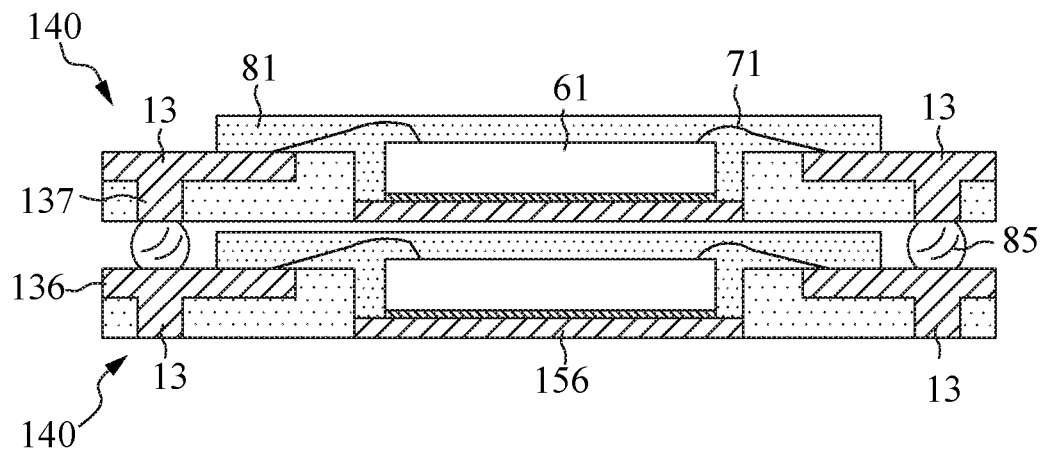
FIGS. 29 and 30 are cross-sectional and top perspective views, respectively, of a three-dimensional stacked semiconductor package having two semiconductor assemblies of FIG. 26 in accordance with the first embodiment of the present invention.
Figure 30:
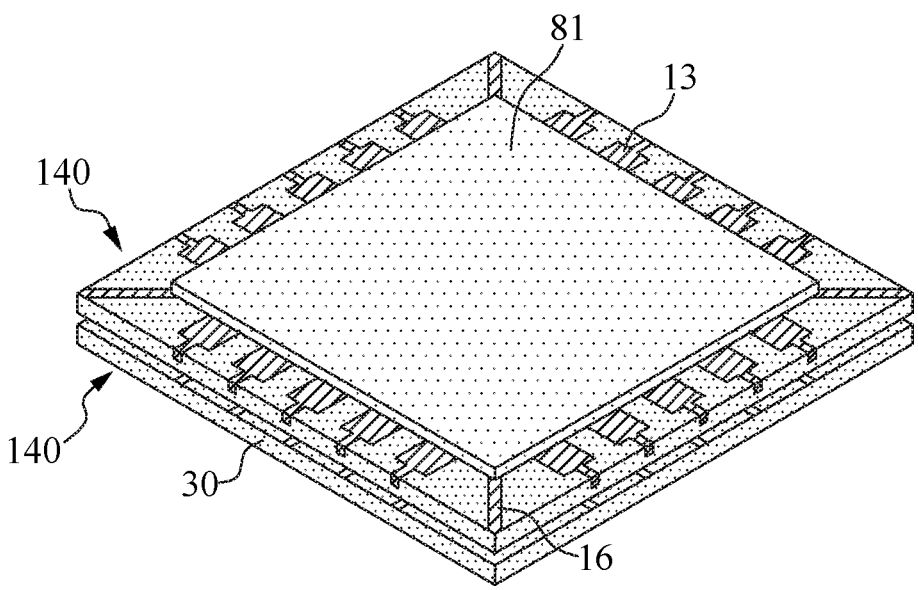

FIGS. 29 and 30 are cross-sectional and top perspective views, respectively, of a three-dimensional stacked semiconductor package having two semiconductor assemblies 140 of FIGS. 26-28 electrically connected to each other by solder balls 85. The upper semiconductor assembly 140 is stacked on and electrically coupled to the lower semiconductor assembly 140 by solder balls 85.

Figure 31:
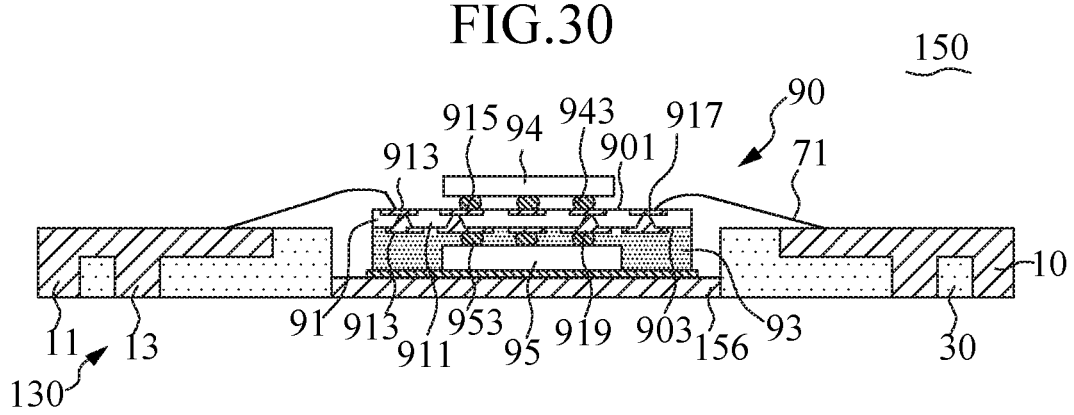
FIG. 31 is a cross-sectional view of another semiconductor assembly having another aspect of the semiconductor device electrically coupled to the untrimmed wiring substrate of FIG. 20 in accordance with the first embodiment of the present invention.

FIG. 31 is a cross-sectional view of another semiconductor assembly 150 having a semiconductor device 90 electrically coupled to the wiring substrate 130 of FIG. 20. The semiconductor device 90 includes a routing circuitry 91, a stiffener 93, a first chip 94 and a second chip 95. In this illustration, the routing circuitry 91 is illustrated as a multi-layered buildup circuitry and includes a dielectric layer 911 and a plurality of wiring layers 113 serially formed in an alternate fashion. The first chip 94 is electrically coupled to the routing circuitry 91 from the top surface 901 of the routing circuitry 91, and the second chip 95 is electrically coupled to the routing circuitry 91 from the bottom surface 903 of the routing circuitry 91. In this embodiment, the first chip 94 is electrically coupled to first conductive pads 915 of the routing circuitry 91 through first conductive bumps 943, whereas the second chip 95 is electrically coupled to second conductive pads 919 of the routing circuitry 91 through second conductive bumps 953 and attached to the paddle layer 156. The routing circuitry 91 is electrically connected to the wiring substrate 130 by bonding wires 71 attached to terminal pads 917 of the routing circuitry 91 and the metal leads 13 of the wiring substrate 130. The stiffener 93 covers the bottom surface 903 of the routing circuitry 91 and surrounds and conformally coats and encapsulates the second chip 95. As an alternative, the stiffener 93 may be omitted.

Figure 32:
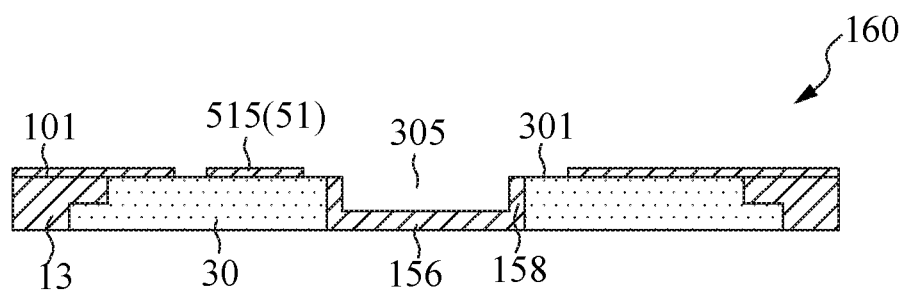
FIGS. 32 and 33 are cross-sectional and top perspective views, respectively, of another aspect of the wiring substrate having a re-distribution layer deposited directly on the resin compound in accordance with the first embodiment of the present invention.
Figure 33:
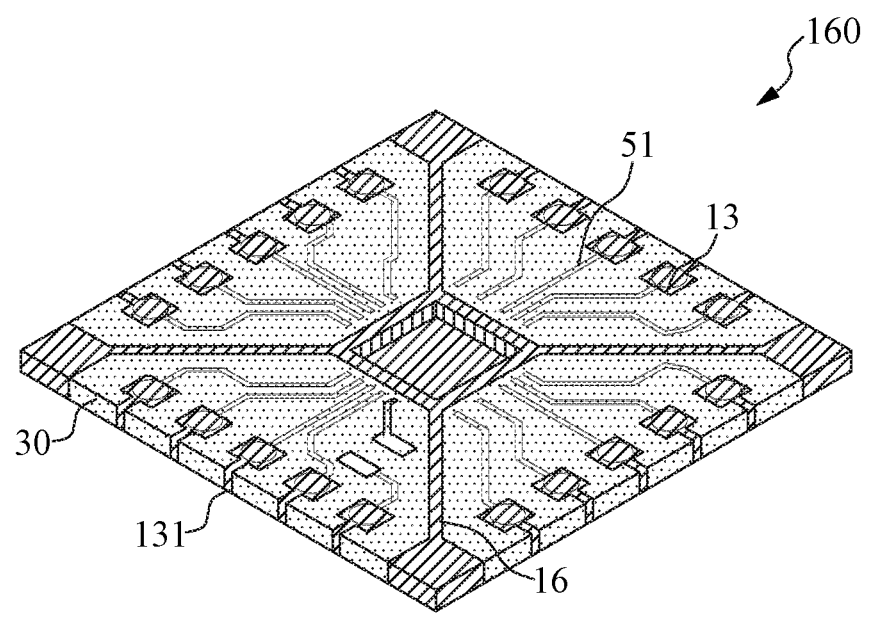

FIGS. 32 and 33 are cross-sectional and top perspective views, respectively, of yet another aspect of the trimmed wiring substrate according to the first embodiment of the present invention. The wiring substrate 160 of this aspect includes a plurality of metal leads 13, a metal paddle 156, a metal film 158, a plurality of tie bars 16, a resin compound 30 and a top re-distribution layer 51. The metal paddle 156 is thinner than the metal leads 13 and the resin compound 30. The metal film 158 is integral with the metal paddle 156 and made of the same material as the metal paddle 156 and connected with the tie bars 16. The top surface of the metal paddle 156 and the lateral surface of the metal film 158 form a cavity 305. The resin compound 30 provides robust mechanical bonds between the metal leads 13 and bonded to the metal paddle 156 and the metal film 158, and offers a dielectric platform for the top re-distribution layer 51 deposited thereon. The top re-distribution layer 51 is formed on the top surface 301 of the resin compound 30 and electrically coupled to the metal leads 13 by metal pattern deposition described below.

Before forming the cavity 305, the top surface of the structure can be metallized to form an electrically conductive layer (typically a copper layer) as a single layer or multiple layers by numerous techniques, such as electroplating, electroless plating, evaporating, sputtering or their combinations. The electrically conductive layer can be made of Cu, Ni, Ti, Au, Ag, Al, their combinations, or other suitable electrically conductive materials. Typically, a seeding layer is formed on the topmost surface of the structure prior to the electrically conductive layer is electroplated to a desirable thickness. The seeding layer may consist of a diffusion barrier layer and a plating bus layer. The diffusion barrier layer is to counterbalance oxidation or corrosion of the electrically conductive layer such as copper. In most cases, the diffusion barrier layer also acts as an adhesion promotion layer to the underlying material and is formed by physical vapor deposition (PVD) such as sputtered Ti or TiW with a thickness in a range from about 0.01 μm to about 0.1 μm. However, the diffusion barrier layer may be made of other materials, such as TaN, or other applicable materials and its thickness range is not limited to the range described above. The plating bus layer is typically made of the same material as the electrically conductive layer with a thickness in a range from about 0.1 μm to about 1 μm. For example, if the electrically conductive layer is copper, the plating bus layer would preferably be a thin film copper formed by physical vapor deposition or electroless plating. However, the plating bus layer may be made of other applicable materials such as silver, gold, chromium, nickel, tungsten, or combinations thereof and its thickness range is not limited to the range described above.

Following the deposition of the seeding layer, a photoresist layer (not shown) is formed over the seeding layer. The photoresist layer may be formed by a wet process, such as a spin-on process, or by a dry process, such as lamination of a dry film. After the photoresist layer is formed, the photoresist layer is patterned to form openings, which are then filled with plated metal such as copper to form the top re-distribution layer 51. The plated metal layer typically has a thickness in a range from about 10 μm to about 100 μm. After metal plating, the exposed seeding layer is then removed by etching process to form electrically isolated conductive traces as desired. In this illustration, the top re-distribution layer 51 is a top patterned metal layer 515 that has a uniform thickness and laterally extends on the top surface 301 of the resin compound 30 as well as the top sides 101 of the metal leads 13.

Figure 34:
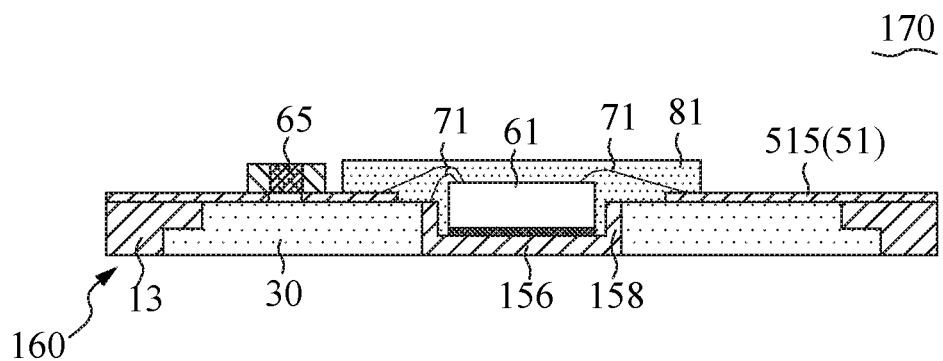
FIGS. 34 and 35 are cross-sectional and top perspective views, respectively, of the structure of FIGS. 32 and 33 further provided with a semiconductor device, a passive component, bonding wires and a molding compound in accordance with the first embodiment of the present invention.
Figure 35:
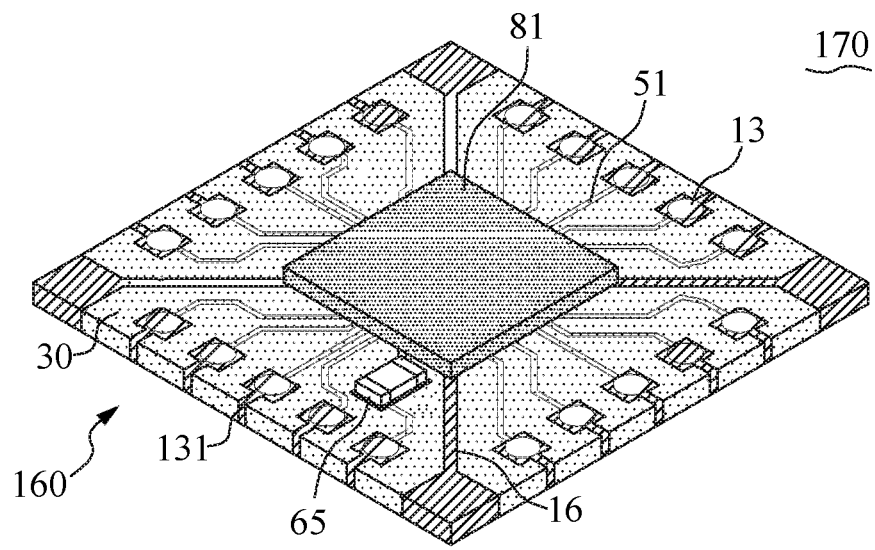

FIGS. 34 and 35 are cross-sectional and top perspective views, respectively, of a semiconductor assembly 170 with a semiconductor device 61 and a passive component 65 electrically connected to the wiring substrate 160 illustrated in FIGS. 32 and 33. The semiconductor device 61 is attached on the metal paddle 156 and electrically coupled to the metal film 158 and the top re-distribution layer 51 through bonding wires 71. The passive component 65 is mounted over the resin compound 30 and electrically coupled to the top re-distribution layer 51. Optionally, a molding compound 81 may be provided to cover and encapsulate the semiconductor device 61 and the bonding wires 71 from above.

Figure 36:
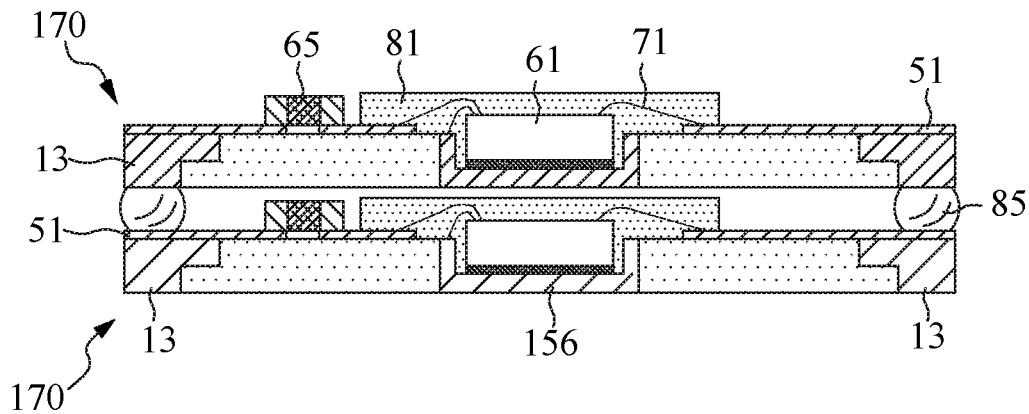
FIG. 36 is a cross-sectional view of a three-dimensional stacked semiconductor package having two semiconductor assemblies of FIG. 34 in accordance with the first embodiment of the present invention.

FIG. 36 is a cross-sectional view of a three-dimensional stacked semiconductor package having two semiconductor assemblies 170 of FIG. 34 electrically connected to each other by solder balls 85. The upper semiconductor assembly 170 is stacked on and electrically coupled to the lower semiconductor assembly 170 by solder balls 85 in contact with the metal leads 13 of the upper semiconductor assembly 170 and the top re-distribution layer 51 of the lower semiconductor assembly 170.

Figure 37:
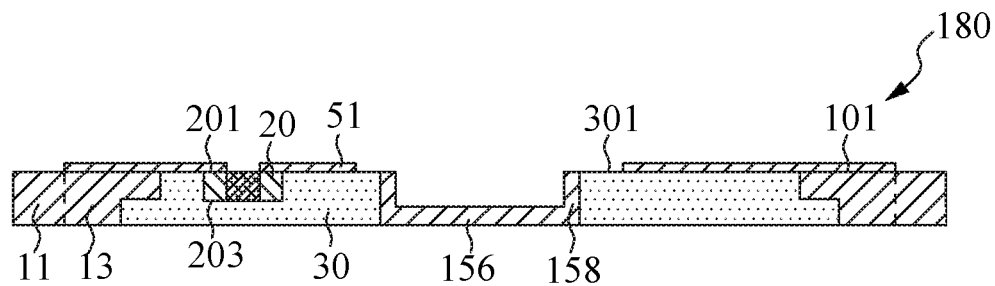
FIG. 37 is a cross-sectional view of yet another aspect of the untrimmed wiring substrate having an electronic compound embedded in the resin compound in accordance with the first embodiment of the present invention.

FIG. 37 is a cross-sectional view of yet another aspect of the untrimmed wiring substrate according to the first embodiment of the present invention. The untrimmed wiring substrate 180 is similar to that illustrated in FIG. 32, except that it further includes an electronic component 20 encapsulated in the resin compound 30 and the metal frame 11 is not yet separated from the metal leads 13. The electronic component 20 is disposed within the metal frame 13 before provision of the resin compound 30. In this embodiment, the electronic component 20 is thinner than the metal leads 13 and the resin compound 30 and has a top side 201 substantially coplanar with the top sides 101 of the metal leads 13 and the top surface 301 of the resin compound 30. The electronic component 20 may be resistors, capacitors, inductors or any other passive or active components. The top re-distribution layer 51 laterally extends on the top surface 301 of the resin compound 30 as well as the top sides 101 of the metal leads 13 and the top side 201 of the electronic component 20. As a result, the top re-distribution layer 51 electrically couples the electronic component 20 to the metal leads 13.

Embodiment 2

FIGS. 38-45 are schematic views showing a method of making a wiring substrate having a bottom build-up circuitry in accordance with the second embodiment of the present invention.

For purposes of brevity, any description in Embodiment 1 is incorporated herein insofar as the same is applicable, and the same description need not be repeated.

Figure 38:
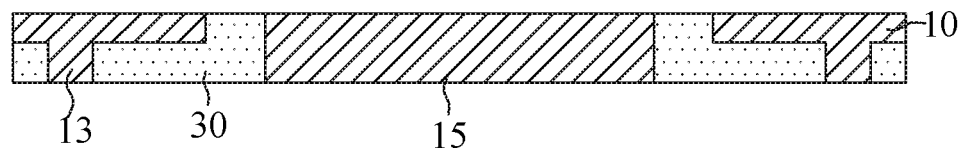
FIGS. 38 and 39 are cross-sectional and bottom perspective views, respectively, of the structure having a textured metal sheet bonded with a resin compound in accordance with the two embodiment of the present invention.
Figure 39:
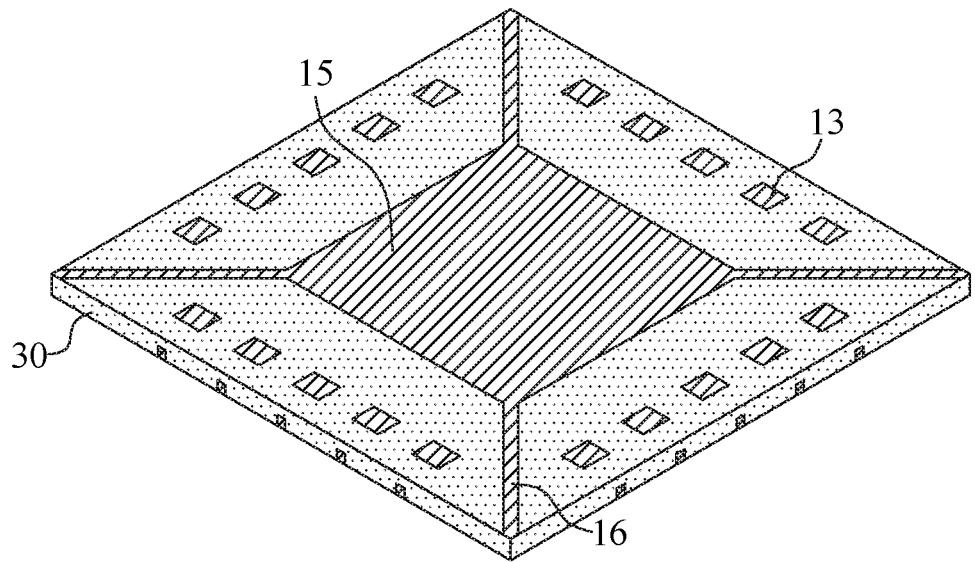

FIGS. 38 and 39 are cross-sectional and bottom perspective views, respectively, of the structure of FIG. 4 after removal of the metal frame 11. Removal of the metal frame 11 can be done by various methods including chemical etching or mechanical trimming/cutting. By separating the metal frame 11, the connection between the metal leads 13 is broken. As a result, the textured metal sheet 10 includes the metal leads 13, the metal slug 15 and the tie bars 16.

Figure 40:
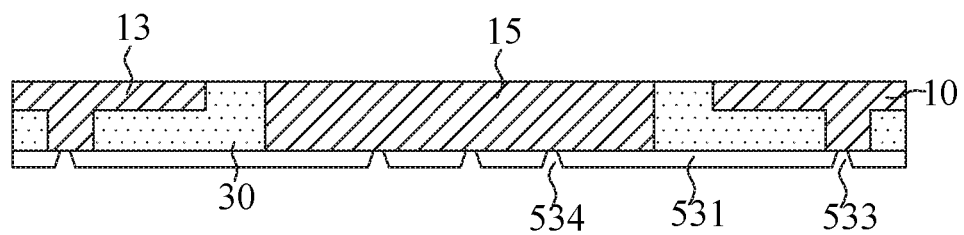
FIGS. 40 and 41 are cross-sectional and bottom perspective views, respectively, of the structure of FIGS. 38 and 39 further provided with a dielectric layer, first via openings and second via openings in accordance with the two embodiment of the present invention.
Figure 41:
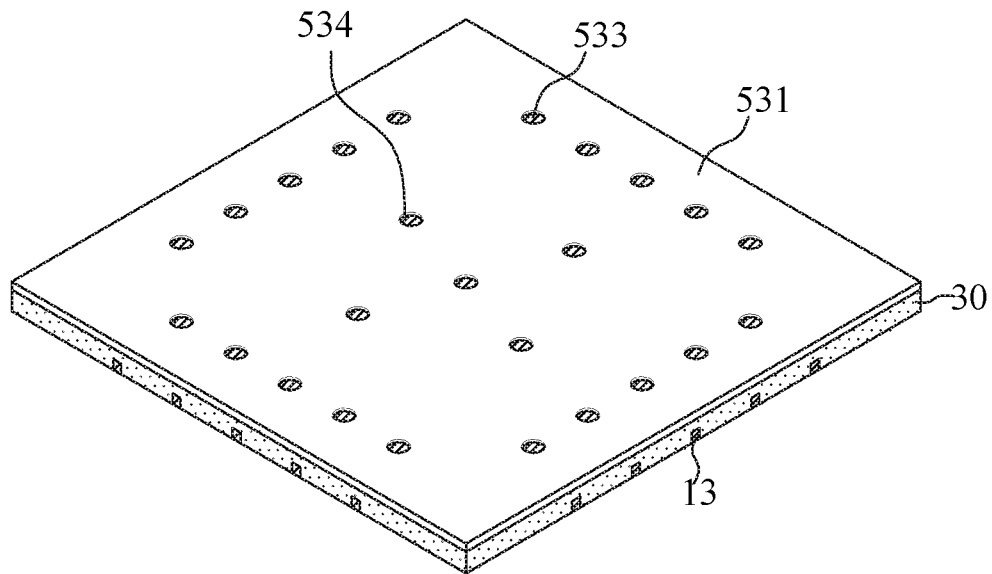

FIGS. 40 and 41 are cross-sectional and bottom perspective views, respectively, of the structure with a dielectric layer 531 formed on the textured metal sheet 10 and the resin compound 30 as well as first via openings 533 and second via openings 534 in the dielectric layer 531. The dielectric layer 531 is deposited typically by lamination or coating, and contacts and covers and extends laterally on the textured metal sheet 10 and the resin compound 30 from below. After the deposition of the dielectric layer 531, the first via openings 533 and the second via openings 534 are formed by numerous techniques, such as laser drilling, plasma etching and photolithography, and typically have a diameter of 50 microns and extend through the dielectric layer 531. Laser drilling can be enhanced by a pulsed laser. Alternatively, a scanning laser beam with a metal mask can be used. The first via openings 533 are aligned with selected portions of the metal leads 13, whereas the second via openings 534 are aligned with selected portions of the metal slug 15.

FIGS. 42 and 43 are cross-sectional and bottom perspective views, respectively, of the structure with a bottom patterned metal layer 535 formed on the dielectric layer 531 by metal deposition and metal patterning process. The bottom patterned metal layer 535 extends from the metal leads 13 and the metal slug 15 in the downward direction, fill up the first via openings 533 and the second via openings 534 to form first metallized vias 537 and second metallized vias 538 in direct contact with the metal leads 13 and the metal slug 15, respectively, and extend laterally on the dielectric layer 531. As a result, the bottom patterned metal layer 535 can provide horizontal routing in both the X and Y directions and vertical routing through the first via openings 533 and the second via openings 534.

At this stage, the formation of a bottom build-up circuitry 53 is accomplished. In this illustration, the bottom build-up circuitry 53 includes the dielectric layer 531 and the bottom patterned metal layer 535.

FIGS. 44 and 45 are cross-sectional and top perspective views, respectively, of the structure after selective removal of the metal slug 15. The metal slug 15 is selectively removed to form a cavity 305. The remaining portion of the metal slug 15 consists of a metal paddle 156 and a metal film 158. The metal paddle 156 is located at the bottom of the cavity 305 and thermally conductible to the bottom build-up circuitry 53 through the second metallized vias 538 as heat pipes. The metal paddle 156 can also be electrically connected to the metal leads 13 through the bottom build-up circuitry 53 for grounding purpose. The metal film 158 is integral with the metal paddle 156 and laterally surrounds the cavity 305. As a result, a wiring substrate 200 is accomplished and includes the metal leads 13, the metal paddle 156, the metal film 158, the tie bars 16, the resin compound 30 and the bottom build-up circuitry 53.

FIGS. 46 and 47 are cross-sectional and top perspective views, respectively, of a semiconductor assembly 210 with a semiconductor device 61 electrically coupled to the wiring substrate 200 and encapsulated by a molding compound 81. The semiconductor device 61 is attached on the metal paddle 156 and electrically coupled to the metal leads 13 and the metal film 158 through bonding wires 71. As a result, the semiconductor device 61 can be thermally conductible to the metal paddle 156 and electrically coupled to the bottom build-up circuitry 53 through the metal leads 13. Optionally, the molding compound 81 may be further provided to cover and encapsulate the semiconductor device 61 and the bonding wires 71 from above.

FIG. 48 is a cross-sectional view of a three-dimensional stacked semiconductor package having the semiconductor assembly 110 of FIG. 14 stacked on the semiconductor assembly 210 of FIG. 46 by solder balls 85. The upper semiconductor assembly 110 is stacked on and electrically coupled to the lower semiconductor assembly 210 by solder balls 85. Optionally, additional solder balls 87 may be further mounted on the bottom build-up circuitry 53 of the lower semiconductor assembly 210.

FIG. 49 is a cross-sectional view of another semiconductor assembly 220 having a semiconductor device 90 electrically coupled to the wiring substrate 200 of FIG. 44. The semiconductor device 90 is similar to that illustrated in FIG. 31, except that it further includes a passive component 97 and a metal pillar 98. The passive component 97 and the metal pillar 98 are electrically coupled to the routing circuitry 91 from the bottom surface 903 of the routing circuitry 91. In this illustration, the second chip 95 is thermally conductible to the metal paddle 156 for heat dissipation, and the metal pillar 98 is electrically connected to the metal paddle 156 for ground connection. The routing circuitry 91 is electrically connected to the wiring substrate 200 by bonding wires 71 attached to the routing circuitry 91 of the semiconductor device 90 and the metal leads 13 of the wiring substrate 200. The stiffener 93 also surrounds and conformally coats and encapsulates the passive component 97 and the metal pillar 98.

Embodiment 3

FIGS. 50-61 are schematic views showing a method of making a semiconductor assembly having a semiconductor device attached on a resin paddle in accordance with the third embodiment of the present invention.

For purposes of brevity, any description in Embodiments above is incorporated herein insofar as the same is applicable, and the same description need not be repeated.

FIG. 50 is a cross-sectional view of a textured metal sheet 10. The textured metal sheet 10 is similar to that illustrated in FIGS. 1-3, except that it includes no tie bars and the metal slug 15 is thinner than the metal frame 11 and the metal leads 13.

FIGS. 51 and 52 are cross-sectional and bottom perspective views, respectively, of the structure provided with a resin compound 30 and a resin paddle 40. The resin compound 30 covers the lower surfaces of the horizontally elongated portions 136 as well as sidewalls of the vertically projected portions 137 and sidewalls of the metal slug 15. The resin paddle 40 covers the bottom side 153 of the metal slug 15 from below and is integral with the resin compound 30. The resin compound 30 and the resin paddle 40 can be integrally formed by applying a resin material into the remaining spaces within the metal frame 11. By planarization, the resin paddle 40 has a bottom surface 403 substantially coplanar with the bottom surface 303 of the resin compound 30 and the bottom sides 103 of the metal frame 11 and the metal leads 13.

FIGS. 53 and 54 are cross-sectional and top perspective views, respectively, of the structure after removal of the metal slug 15. The metal slug 15 is entirely removed to form a cavity 305 and expose the top surface 401 of the resin paddle 40 from the cavity 305. At this stage, an untrimmed wiring substrate 300 is accomplished and includes the metal frame 11, the metal leads 13, the resin compound 30 and the resin paddle 40.

FIGS. 55 and 56 are cross-sectional and top perspective views, respectively, of the structure with a semiconductor device 61 electrically coupled to the wiring substrate 300. The semiconductor device 61 is face-up disposed in the cavity 305 and attached on the resin paddle 40 and electrically coupled to the metal leads 13 through bonding wires 71.

FIGS. 57 and 58 are cross-sectional and top perspective views, respectively, of the structure provided with a molding compound 81. Optionally, the molding compound 81 may be further provided to cover and encapsulate the semiconductor device 61 and the bonding wires 71 from above.

FIGS. 59, 60 and 61 are cross-sectional, top and bottom perspective views, respectively, of a semiconductor assembly 310 after removal of the metal frame 11. Removal of the metal frame 11 can be done by various methods including chemical etching or mechanical trimming/cutting. By separating the metal frame 11, the connection between the metal leads 13 is broken. As a result, the wiring substrate 300 includes the metal leads 13, the resin compound 30 and the resin paddle 40.

FIGS. 62 and 63 are cross-sectional and top perspective views, respectively, of a three-dimensional stacked semiconductor package having two semiconductor assemblies 310 of FIG. 59 electrically connected to each other by solder balls 85. The upper semiconductor assembly 310 is stacked on and electrically coupled to the lower semiconductor assembly 310 by solder balls 85.

FIG. 64 is a cross-sectional view of another semiconductor assembly 320 having a semiconductor device 90 electrically coupled to the wiring substrate 300 of FIG. 53 through bonding wires 71. The semiconductor device 90 is similar to that illustrated in FIG. 49, except that (i) the first chip 94 is electrically connected to the routing circuitry 91 by bonding wires 945, (ii) a third chip 96 is further provided and electrically coupled to the routing circuitry 91 through third conductive bumps 963, and (iii) no metal pillar 98 is encapsulated in the stiffener 93. As a result, the first chip 94, the second chip 95 and the third chip 96 can be electrically connected to the wiring substrate 300 through the routing circuitry 91 and the bonding wires 71 attached to the routing circuitry 91 and the metal leads 13.

FIG. 65 is a cross-sectional view of another aspect of the wiring substrate according to the third embodiment of the present invention. The wiring substrate 330 of this aspect includes a plurality of metal leads 13, a resin compound 30, a resin paddle 40 and a top re-distribution layer 51. The top surface of the resin paddle 40 and the interior sidewall surface of the resin compound 30 form a cavity 305. The top re-distribution layer 51 is formed on the top surface 301 of the resin compound 30 and electrically coupled to the metal leads 13. In this illustration, the top re-distribution layer 51 is a top patterned metal layer 515.

FIG. 66 is a cross-sectional view of yet another aspect of the wiring substrate according to the third embodiment of the present invention. The wiring substrate 340 is similar to that illustrated in FIG. 65, except that it further includes a metal layer 46 on the top surface of the resin paddle 40. In this aspect, the metal layer 46 is formed by selectively removing the metal slug 15 illustrated in FIG. 51 and leaving a remaining portion of the metal slug 15 on the resin paddle 40.

FIG. 67 is a cross-sectional view of yet another aspect of the wiring substrate according to the third embodiment of the present invention. The wiring substrate 350 is similar to that illustrated in FIG. 66, except that it further includes a metal film 48 on the interior sidewall surface of the resin compound 30 and a bottom build-up circuitry 53 on the bottom surface 303 of the resin compound 30 and the bottom surface 403 of the resin paddle 40 and electrically coupled to the metal leads 13. The metal layer 46 and the metal film 48 are integral with each other and formed by selectively removing the metal slug 15 illustrated in FIG. 51 to leave remaining portions of the metal slug 15 on the top surface of the resin paddle 40 and the interior sidewall surface of the resin compound 30. In this illustration, the bottom build-up circuitry 53 includes a dielectric layer 531 and a bottom patterned metal layer 535 in an alternate fashion. The dielectric layer 531 contacts and covers and extends laterally on the metal leads 13, the resin compound 30 and the resin paddle 40 from below. The bottom patterned metal layer 535 extends laterally on the dielectric layer 531 and includes first metallized vias 537 in contact with the metal leads 13.

FIG. 68 is a cross-sectional view of a semiconductor assembly 360 with a semiconductor device 61 and a passive component 65 electrically connected to the wiring substrate 350 of FIG. 67. The semiconductor device 61 is attached on the metal layer 46 and electrically coupled to the top re-distribution layer 51 through bonding wires 71. Accordingly, the semiconductor device 61 can be connected to the bottom build-up circuitry 53 through the bonding wires 71, the top re-distribution layer 51 and the metal leads 13. The passive component 65 is mounted over the resin compound 30 and electrically coupled to the top re-distribution layer 51. Optionally, a molding compound 81 may be provided to cover and encapsulate the semiconductor device 61, the passive component 65 and the bonding wires 71 from above.

As illustrated in the aforementioned embodiments, a distinctive wiring substrate is configured to have a cavity surrounded by metal leads. The wiring substrate of the present invention includes: a plurality of metal leads each having an inner end directed toward a predetermined area and an outer end situated farther away from the predetermined area than the inner end; a resin compound that fills in spaces between the metal leads and laterally extends beyond the inner ends of the metal leads and into the predetermined area to surround a cavity at the predetermined area, wherein the resin compound has a top surface substantially coplanar with top sides of the metal leads; and a paddle layer that is located adjacent to a bottom of the cavity and thinner than resin compound and the metal leads and has a bottom surface substantially coplanar with that of the resin compound. In a preferred embodiment, the metal leads are separated from a metal frame and can serve as horizontal and vertical signal transduction pathways or provide ground/power plane for power delivery and return; the resin compound surrounds the cavity and is bonded to the metal leads and has an interior sidewall surface extending beyond the top surface of the paddle layer; the cavity is formed by selectively or entirely removing a metal slug; and the paddle layer may be a metal paddle or a resin paddle and covers the bottom of the cavity and is surrounded by the resin compound.

Each of the metal leads preferably is an integral one-piece lead and can be separated from a metal frame after provision of the resin compound. The metal leads separated from the metal frame have top and bottom sides and an exterior lateral surface perpendicular to the top and bottom sides and not covered by the resin compound. In a preferred embodiment, the metal leads have a thickness in a range from about 0.15 mm to about 1.0 mm and laterally extend at least to a perimeter coincident with peripheral edges of the resin compound. For secure bonds between the metal leads and the resin compound, the metal leads may have stepped peripheral edges interlocked with the resin compound. As a result, the resin compound also has a stepped cross-sectional profile where it contacts the metal leads so as to prevent the metal leads from being vertically forced apart from the resin compound and also to avoid micro-cracking at the interface along the vertical directions.

The resin compound can be bonded to the metal leads by paste printing, compressive molding, transfer molding, liquid injection molding, spin coating, or other suitable methods. Preferably, the resin compound has a top surface substantially coplanar with the top sides of the metal leads, and a bottom surface substantially coplanar with the bottom sides of the metal leads. Further, the resin compound may have an elastic modulus larger than 1.0 GPa, a linear coefficient of thermal expansion in a range from about $5 \times 10^{-6}$ $K^{-1}$ to about $15 \times 10^{-6}$ $K^{-1}$. Additionally, for sufficient thermal conductivity and suitable viscosity, the resin compound may include thermally conductive fillers in a range of 10 to 90% by weight. For instance, the thermally conductive fillers may be made of aluminum nitride (AlN), aluminum oxide, silicon carbide (SiC), tungsten carbide, boron carbide, silica or the like and preferably has relatively high thermal conductivity, high electrical resistance, and a relatively low CTE. Accordingly, the resin compound would exhibit improved heat dissipation performance, electrical isolation performance and shows inhibition of delamination or cracking of the top re-distribution layer deposited thereon or interfaces due to low CTE. Additionally, the maximum particle size of the thermally conductive fillers may be 25 μm or less.

The paddle layer can be made of a metal material or a resin material. For instance, in a thermally enhanced case, the metal slug within the metal frame is selectively removed after provision of the resin compound to leave a remaining portion of the metal slug as a metal paddle that is made of the same material as the metal leads and has peripheral edges boned to the resin compound and a bottom surface substantially coplanar with that of the resin compound and the metal leads. Accordingly, the cavity can have a metallic bottom as a thermal dissipation platform or/and a vertical EMI (electromagnetic interference) shield for a semiconductor device attached thereon, so that the heat generated by the semiconductor device can be conducted away through the metallic paddle layer and/or vertical EMI can be reduced. Optionally, the step of selectively removing the metal slug may further include leaving an additional remaining portion of the metal slug on the interior sidewall surface of the resin compound. As a result, the interior sidewall surface of the resin compound can be completely covered by a metal film integral with the metal paddle, and the cavity has metallic sidewalls for providing horizontal EMI (electromagnetic interference) shielding for the semiconductor device disposed in the cavity. As an alternative case, the metal slug may be thinner than the metal leads and the resin compound, and the step of providing the resin compound includes providing a resin paddle as the paddle layer on a bottom side of the metal slug. In a preferred embodiment, the resin paddle is integral with the resin compound and made of the same material as that of the resin compound and has a bottom surface substantially coplanar with that of the resin compound and the metal leads. The resin paddle and the resin compound can be integrally formed by, for example, a molding process of a resin material. Optionally, the top surface of the resin paddle may be further covered by a remaining portion of the metal slug, and the combined thickness of the resin paddle and the remaining portion of the metal slug is less than that of the resin compound. Accordingly, the remaining portion of the metal slug can offer a thermal dissipation platform or/and vertical EMI shielding for a semiconductor device attached thereon. Likewise, the interior sidewall surface of the resin compound may be further covered by an additional remaining portion of the metal slug to provide vertical EMI shielding for the semiconductor device disposed in the cavity.

Optionally, a top re-distribution layer may be further deposited on the top surface of the resin compound and electrically coupled to the metal leads to increase routing flexibility of the wiring substrate. The top re-distribution layer may be a top patterned metal layer formed by metal deposition using photolithographic process and having a uniform thickness less than the thickness of the metal leads. In a preferred embodiment, the top patterned metal layer contacts and laterally extends on the top surface of the resin compound and further laterally extends onto the top sides of the metal leads by a sputtering process and then an electrolytic plating process. As a result, the top re-distribution layer can provide electrical contacts on the resin compound for device connection.

Optionally, an electronic component may be further provided to be encapsulated in the resin compound and electrically connected to the metal leads through the top re-distribution layer. In a preferred embodiment, the electronic component is thinner than the metal leads and has a top side electrically coupled to the top re-distribution layer and a bottom side covered by the resin compound. The electronic component may be a resistor, capacitor, inductor or any other passive or active component.

Optionally, a bottom build-up circuitry may be further deposited on the bottom surface of the resin compound and electrically connected to the top re-distribution layer through the metal leads. By double routing circuitries on two sides of the resin compound, the routing flexibility of the wiring substrate can be enhanced. In a preferred embodiment, the bottom build-up circuitry includes at least one dielectric layer and at least one bottom patterned metal layer extending through the dielectric layer and extending laterally on the dielectric layer. The dielectric layer and the bottom patterned metal layer are serially formed in an alternate fashion and can be in repetition when needed. Accordingly, the bottom build-up circuitry can be electrically coupled to the metal leads and thermally conductible to the metallic paddle layer through metallized vias in the dielectric layer.

The present invention also provides a semiconductor assembly in which a semiconductor device is electrically connected to the aforementioned wiring substrate. Specifically, the semiconductor device can be face-up disposed over the top surface of the paddle layer and electrically connected to the metal leads by bonding wires attached to the metal leads or the top re-distribution layer. In a thermally enhanced case, the semiconductor device is attached on the remaining portion of the metal slug, and may be further electrically coupled to the additional remaining portion of the metal slug on the interior sidewall surface of the resin compound through at least one bonding wire for ground connection.

The assembly can be a first-level or second-level single-chip or multi-chip device. For instance, the assembly can be a first-level package that contains a single chip or multiple chips. Alternatively, the assembly can be a second-level module that contains a single package or multiple packages, and each package can contain a single chip or multiple chips.

The semiconductor device can be a packaged or unpackaged chip. For instance, the semiconductor device can be a bare chip, or a wafer level packaged die, etc. Alternatively, the semiconductor device may include a routing circuitry, a first chip and a second chip. The first chip can be electrically coupled to a top surface of the routing circuitry by a well-known flip chip bonding process with its active surface facing in the routing circuitry using conductive bumps without metallized vias in contact with the first chip, or by wire bonding process with its active surface facing away the routing circuitry using bonding wires. Likewise, the second chip can be electrically coupled to a bottom surface of the routing circuitry by a well-known flip chip bonding process with its active surface facing in the routing circuitry using conductive bumps without metallized vias in contact with the second chip. Optionally, the semiconductor device may further include a stiffener bonded to the routing circuitry and laterally surrounding the second chip.

The routing circuitry can be a buildup circuitry without a core layer to provide primary fan-out routing/interconnection and the shortest interconnection distance between the first and second chips. Preferably, the routing circuitry is a multi-layered buildup circuitry and includes at least one dielectric layer and at least one wiring layer that extend laterally on the dielectric layer and has conductive vias in the dielectric layer. The dielectric layer and the wiring layer are serially formed in an alternate fashion and can be in repetition when needed. Accordingly, the routing circuitry can be formed with first conductive pads and optionally terminal pads at its top surface and second conductive pads at its bottom surface. The first conductive pads and the terminal pads can be electrically connected to the second conductive pads through conductive vias. Further, the terminal pads are electrically connected to the metal leads or the top re-distribution layer of the wiring substrate. In a preferred embodiment, the terminal pads for bonding wire connection and have larger pad size and pad pitch than those of the first conductive pads, the second conductive pads and I/O pads of the first and second chips. The optional stiffener laterally extends to peripheral edges of the routing circuitry to provide mechanical support for the routing circuitry. The stiffener can conformally coat and encapsulate the second chip, or have an aperture aligned with the second conductive pads to expose the second conductive pads of the routing circuitry. Accordingly, the bottom surface of the routing circuitry and interior sidewall surfaces of the aperture of the stiffener can form a cavity in the aperture of the stiffener, and the second chip can be disposed in the cavity and have peripheral edges spaced from the interior sidewall surfaces of the aperture of the stiffener and be electrically coupled to the second conductive pads. In a preferred embodiment, the stiffener has a thickness substantially equal to the combined thickness of the second chip and the second conductive pads.

The term "cover" refers to incomplete or complete coverage in a vertical and/or lateral direction. For instance, the resin compound covers sidewalls of the metal leads regardless of whether another element is between the metal leads and the resin compound.

The phrases "attached to" and "attached on" include contact and non-contact with a single or multiple support element(s). For instance, in a preferred embodiment, the semiconductor device can be attached to the resin paddle regardless of whether the semiconductor device is separated from the resin paddle by the metal layer.

The phrases "electrical connection", "electrically connected" and "electrically coupled" refer to direct and indirect electrical connection. For instance, in a preferred embodiment, the semiconductor device can be electrically connected to the metal leads by the bonding wires but does not contact the metal leads.

The wiring substrate according to the present invention has numerous advantages. The metal paddle establishes a heat dissipation pathway for spreading out the heat generated by the semiconductor device. The resin compound provides robust mechanical bonds between the metal leads, and offers a dielectric platform for the top re-distribution layer and/or the bottom build-up circuitry deposited thereon. The metal leads provide primary horizontal and vertical routing, and the top re-distribution layer and the bottom build-up circuitry offer further routing to increase routing flexibility of the wiring substrate. The wiring substrate made by this method is reliable, inexpensive and well-suited for high volume manufacture.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

What is claimed is:

1. A method of making a wiring substrate, the method comprising steps of:
   providing a metal frame, a metal slug and a plurality of metal leads having stepped peripheral edges, wherein the metal slug is located within the metal frame, and the metal leads are spaced apart from the metal slug and integrally connected to the metal frame and each has an inner end directed inwardly away from the metal frame and directed toward the metal slug;
   providing a resin compound that fills in remaining spaces within the metal frame, wherein the remaining spaces are within the metal frame other than occupied by the metal slug and the metal leads, wherein the resin compound has a top surface coplanar with top sides of the metal leads and the metal slug;
   removing a selected portion of the metal slug to form a cavity, wherein the cavity has an entrance at the top surface of the resin compound, and
   wherein the metal slug is located at a central area within the metal frame and connected to the metal frame by tie bars and the metal leads are placed around the periphery of the cavity between the tie bars and the metal frame.

2. The method of claim 1, further comprising a step of separating the metal frame from the metal leads.

3. The method of claim 2, wherein the step of separating the metal frame includes chemical etching or mechanical trimming or cutting.

4. The method of claim 1, wherein the step of removing the selected portion of the metal slug includes leaving a remaining portion of the metal slug as a metal paddle located adjacent to a bottom of the cavity.

5. The method of claim 4, wherein the metal paddle has a bottom surface coplanar with those of the resin compound and the metal leads.

6. The method of claim 4, wherein the step of removing the selected portion of the metal slug further includes leaving an additional remaining portion of the metal slug on an interior sidewall surface of the resin compound.

7. The method of claim 1, further comprising a step of forming a top re-distribution layer on the top surface of the resin compound and electrically coupled to the metal leads.

8. The method of claim 7, further comprising a step of disposing an electronic component within the metal frame before the step of providing the resin compound, wherein the top re-distribution layer further electrically couples the electronic component to at least one of the metal leads.

9. The method of claim 1, further comprising a step of forming a bottom build-up circuitry on a bottom surface of the resin compound and electrically coupled to the metal leads.

10. The method of claim 9, wherein the step of removing the selected portion of the metal slug includes leaving a remaining portion of the metal slug as a metal paddle located adjacent to a bottom of the cavity, and the bottom build-up circuitry is electrically to and thermally conductible to the metal paddle.

11. The method of claim 1, wherein the metal slug is thinner than the metal leads, and the step of providing the resin compound includes providing a resin paddle on a bottom side of the metal slug, the resin paddle being integral with the resin compound.

12. A method of making a stackable semiconductor assembly, the method comprising steps of:
   providing a wiring substrate that includes steps of:
   providing a metal frame, a metal slug and a plurality of metal leads having stepped peripheral edges, wherein the metal slug is located within the metal frame, and the metal leads are spaced apart from the metal slug and integrally connected to the metal frame and each has an inner end directed inwardly away from the metal frame and directed toward the metal slug:
   providing a resin compound that fills in remaining spaces within the metal frame, wherein the remaining spaces are within the metal frame other than occupied by the metal slug and the metal leads, wherein the resin compound has a top surface coplanar with top sides of the metal leads and the metal slug: and removing a selected portion of the metal slug to form a cavity, wherein the cavity has an entrance at the top surface of the resin compound;

wherein the metal slug is located at a central area within the metal frame and connected to the metal frame by tie bars and the metal leads are placed around the periphery of the cavity between the tie bars and the metal frame;

depositing a semiconductor device in the cavity of the wiring substrate and electrically coupling the semiconductor device to the wiring substrate through bonding wires; and providing a molding compound to cover and encapsulate the semiconductor device and the bonding wires.

13. The method of claim 12, wherein the step of removing the selected portion of the metal slug includes leaving a remaining portion of the metal slug as a metal paddle located adjacent to a bottom of the cavity and leaving an additional remaining portion of the metal slug on an interior sidewall surface of the resin compound, and the step of electrically coupling the semiconductor device to the wiring substrate includes electrically coupling the semiconductor device to the additional remaining portion of the metal slug through at least one of the bonding wires.

14. The method of claim 12, wherein (i) the semiconductor device includes a routing circuitry, a first chip and a second chip, (ii) the first chip is electrically coupled to a top surface of the routing circuitry, (iii) the second chip is electrically coupled to a bottom surface of the routing circuitry, and (iv) the bonding wires electrically couple the routing circuitry to the wiring substrate.

* * * * *